(12) United States Patent
Kobayashi

(10) Patent No.: US 6,411,229 B2
(45) Date of Patent: Jun. 25, 2002

(54) VARIABLE LENGTH DECODER

(75) Inventor: Yoshikazu Kobayashi, Hiroshima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/842,652

(22) Filed: Apr. 27, 2001

(30) Foreign Application Priority Data

Apr. 28, 2000 (JP) ........................................ 2000-129106

(51) Int. Cl.[7] .................................................. H03M 7/40
(52) U.S. Cl. ........................................... 341/67; 341/63
(58) Field of Search ........................... 341/67, 65, 106, 341/95, 63, 50

(56) References Cited

U.S. PATENT DOCUMENTS 5,835,033 A * 11/1998 Mita ........................... 341/63
5,969,650 A * 10/1999 Wilson ........................ 341/67

FOREIGN PATENT DOCUMENTS

JP         8-288858        11/1996

* cited by examiner

*Primary Examiner*—Brian Young
*Assistant Examiner*—John Nguyen
(74) *Attorney, Agent, or Firm*—Wenderoth, Lind & Ponack, L.L.P.

(57) ABSTRACT

The present invention provides a variable length decoder which can reduce the processing time. The variable length decoder of the present invention comprises plural decoding table address generation circuits, and a selector for selecting one of plural address candidates generated from these circuits. During decoding of one variable length code, the variable length decoder obtains address candidates for the next variable length code, and then selects one of the address candidates for the next variable length code on the basis of an obtained code length of the variable length code, to output the same to the decoding table RAM.

8 Claims, 18 Drawing Sheets

Fig.13

| Row number (decimal number) | Pattern register 1203 (binary number) | Code length register 1204 (decimal number) | Additional bit length register 1206 (decimal number) |
|---|---|---|---|
| 1 | 00 | 2 | 1 |
| 2 | 01 | 2 | 2 |
| 3 | 100 | 3 | 3 |
| 4 | 1010 | 4 | 0 |
| 5 | 1011 | 4 | 4 |
| 6 | 1100 | 4 | 1 |
| 7 | - | - | - |
| 8 | - | - | - |
| 9 | - | - | - |
| 10 | - | - | - |
| 11 | - | - | - |
| 12 | - | - | - |
| 13 | - | - | - |
| 14 | - | - | - |
| 15 | - | - | - |
| 16 | - | - | - |

VARIABLE LENGTH DECODER

FIELD OF THE INVENTION

The present invention relates to an apparatus for inversely converting and decoding variable-length-coded compressed code sequences.

BACKGROUND OF THE INVENTION

In recent years, techniques for decoding high-efficiently coded and compressed images are eagerly researched, and used in the fields of computers, communication, broadcasting and the like. In addition, Joint Photographic Coding Experts Group (JPEG) is recommended as an International Standard of compression coding and decompression decoding of these images, and Moving Picture Experts Group 1 (MPEG1) video and Moving Picture Experts Group 2 (MPEG2) Video are recommended as International Standards of moving picture decoding.

According to these methods, image information is divided into blocks each being composed of a predetermined number of pixels. Each pixel included in the block is orthogonally transformed, quantized, and entropy-coded, to generate a code (in these method, a Huffman code is used). Plural generated codes are combined to compose a compressed code sequence (also referred to simply as a code sequence). The compressed code sequence is entropy-decoded, inversely quantized, and inversely-orthogonally transformed, for each code, to generate a restored image.

It should be noted here that the processing of orthogonally transforming, quantizing, and entropy-coding each pixel is hereinafter referred to as compression coding (or referred to simply as coding), and distinguished from the entropy coding. In addition, it should be noted that the processing of entropy-decoding, inversely quantizing, and inversely-orthogonally transforming a code is referred to as decompression decoding (or referred to simply as decoding), and distinguished from the entropy decoding.

Hereinafter, a description is given of a structure of a circuit for compressing/decompressing common images according to a baseline method as a function which is essential to an image encoder/decoder in conformance with the JPEG recommendation. FIG. 2 is a block diagram illustrating the circuit for compressing/decompressing images according to the JPEG baseline method.

This compression/decompression circuit comprises a block transformation unit 201, a DCT unit 202, a quantization unit 203, a Huffman coding unit 204, a marker generation unit 205, a Huffman decoding unit 206, and a marker decryption unit 207. Here, only the descriptions relating to the decompression decoding are given. The compression coding which has no direct bearing on the present invention is not described here. The marker decryption unit 207 decrypts a marker section which is stored at the head of the compressed code sequence, obtains information at the coding of a target image such as the size of the image, a quantization table and an entropy decoding table, and stores the information in a quantization table RAM (not shown) or an entropy decoding table RAM (not shown in FIG. 2).

The Huffman decoding unit 206 entropy-decodes an entropy code section which is stored subsequent to the marker section of the compressed code sequence, and has been subjected to Huffman coding which is a kind of variable length coding and also a kind of entropy coding, in accordance with an entropy decoding table stored in the entropy decoding table RAM, to output a quantization DCT coefficient.

The quantization unit 203 multiplies a corresponding element of a quantization table stored in the quantization table RAM by the quantization DCT coefficient, and outputs a DCT coefficient to carry out the inverse quantization. The DCT unit 202 subjects the DCT coefficient to inverse transformation of DCT (Discrete Cosine Transformation) as a kind of the orthogonal transformation, and outputs pixel data of a block composed of 8 pixels x 8 pixels. The block transformation unit 201 rearranges the pixel data which have been received in block units, to output a restored image. Since the DCT and the quantization are already known techniques, they are not described in detail here. Further, the processed contents of the marker decryption unit 207 and the processed contents in the block transformation unit 201 are also well-known to persons expert in JPEG, and the processing circuit can be easily constructed. Therefore, the detailed descriptions thereof are not given here.

Before describing the remaining Huffman decoding unit 206, a structure of the compressed code sequence of JPEG is described with reference to FIG. 3.

FIG. 3 shows that the compressed code sequence includes a marker section 301 at the head, followed by an entropy code section 302. The entropy code section 302 has a structure in which a Huffman code 303 as a variable length code and an additional bit 304 are alternately repeated. The code length (hereinafter referred to as "Lh") of the Huffman code 303 is obtained from the Huffman code 303 itself, while the additional bit 304 is an uncoded binary bit string, and its bit length (hereinafter referred to as "La") is obtained from the result of the entropy decoding of the Huffman code 303.

Next, the Huffman decoding unit 206 shown in FIG. 2 of the compression/decompression circuit is described with reference to FIG. 14. The Huffman decoding unit 206 comprises a code location unit 2101, a boundary code register 2102, a Huffman code length detection unit 2103, a base address register 2104, an address generation unit 2105, an entropy decoding table RAM 2106, and an additional bit decoding unit 2107.

The code location unit 2101 extracts a 16-bit bit string which is a bit string of the maximum code length (hereinafter referred to as "Lhmax") of the Huffman code from the head of the compressed code sequence, and outputs the 16-bit bit string to the Huffman code length detection unit 2103 and the address generation unit 2105. Further, it extracts a 11-bit bit string which is a bit string of the maximum bit length (hereinafter referred to as "Lamax") of the additional bit from the head of the compressed code sequence, and outputs the 11-bit bit string to the additional bit decoding unit 2107. When the Huffman code length Lh is obtained by the Huffman code length detection unit 2103, the code location unit 2101 carries out a shift operation of the Huffman code length Lh, obtains the next data from the compressed code sequence as required, and locates the additional bit. Further, when the additional bit length La is obtained from the entropy decoding table RAM 2106, the code location unit 2101 carries out the shift operation of the additional bit length La, and obtains the next data from the compressed code sequence as required, and locates the next Huffman code.

Prior to the start of the decompression decoding, the minimum code value for each code length is stored in the boundary code register 2102.

The Huffman code length detection unit 2103 compares the 16-bit bit string obtained by the code location unit 2101 with the contents of the boundary code register 2102, assumes that the Huffman code exists from the head of the bit string obtained by the code location unit 2101, and detects the code length Lh. As described above, in the case of the Huffman code, the code length can be obtained before referring to the decoding table RAM 2106.

Prior to the start of the decompression decoding, a base address which is an address of the entropy decoding table RAM 2106, corresponding to the Huffman code of the minimum code value for each code length is stored in the base address register 2104.

The address generation unit 2105 compares the 16-bit bit string obtained by the code location unit 2101, the Huffman code length Lh obtained by the Huffman code length detection unit 2102 and the contents of the base address register 2104, and generates an address for referring to the entropy decoding table RAM 2106.

Prior to the start of the decompression decoding, the bit length of an additional bit corresponding to each codeword is stored in the entropy decoding table RAM 2106.

The additional bit decoding unit 2107 extracts a bit string of the additional bit length La obtained from the entropy decoding table RAM 2106, from the head of the 11-bit bit string obtained by the code location unit 2101, and outputs the extracted bit string as a quantization DCT coefficient.

FIG. 15 is a diagram showing the relationship between the boundary code register 2102 and the Huffman code length detection unit 2103. The boundary code register 2102 is a register file which is constituted by plural registers, i.e., a register 2201–1 for containing a boundary code of an 1-bit length Huffman code, a register 2201–2 for containing a boundary code of a 2-bit length Huffman code, . . . , and a register 2201–16 for containing a boundary code of a 16-bit length Huffman code. Prior to the start of the decompression decoding, the minimum code values for the respective code lengths are stored in the boundary code register 2102 as the boundary codes.

The Huffman code length detection unit 2103 comprises a 1-bit size comparator 2202–1, 2- bit size comparator 2202–2, . . . , 16-bit size comparator 2202–16, a priority encoder 2203, and a selector 2204. The Huffman code length detection unit 2103 compares 1 bit from the head of an input bit string with the boundary code stored in the register 2201–1 of the boundary code register 2102, which contains the boundary code of 1-bit length, by means of the size comparator 2202–1. Similarly, the Huffman code length detection unit compares 2 bits from the head of the input bit string with the boundary code stored in the register 2202–2 which contains the boundary code of 2-bit length, by means of the size comparator 2202–2. This is performed up to 16 bits which are the maximum code length of the Huffman code.

From the 16 results of the size comparison, the priority encoder 2203 outputs the minimum of the code lengths for which the bit string of the boundary code is shorter, as the Huffman code length Lh.

The selector 2204 selects the boundary code of the code length output from the priority encoder 2203, which is indicated by the Huffman code length Lh, from the boundary code register 2102, and outputs the same as the boundary code.

FIG. 16 is a diagram showing the relationship between the base address register 2104 and the address generation unit 2105. The base address register 2104 is a register file constituted by plural registers, which contains addresses of the entropy decoding table RAM 2106. The base address register 2104 is constituted by a register 2301–1 for containing an address corresponding to a Huffman code which is the minimum value among 1-bit length Huffman codes, a register 2301–2 for containing an address corresponding to a Huffman code which is the minimum value among 2-bit length Huffman codes, . . . , and a register 2301–16 for containing an address corresponding to a Huffman code which is the minimum value among 16-bit length Huffman codes. Prior to the start of the decompression decoding, the address of the entropy decoding table RAM 2106 corresponding to the Huffman code of the minimum code value for each code length is stored in the base address register 2104 as the base address.

The address generation unit 2105 comprises a selector 2302, a selector 2303, an adder 2304 and an adder 2305.

The selector 2302 selects a base address corresponding to the input Huffman code length Lh from the base addresses stored in the base address register 2140, and outputs the selected base address to the adder 2305. The selector 2303 selects a bit string from the head of a bit string which is a part of the input compressed code sequence so that bits of the input Huffman code length Lh become effective bits, and outputs the selected bit string to the adder 2304.

The adder 2304 subtracts the input boundary code from the bit string input from the selector 2303, and output the results to the adder 2305. The adder 2305 adds the value input from the adder 2304 and the value input from the selector 2302, and output the result as the address.

The operation of the above-mentioned conventional Huffman decoding unit is described with reference to a timing chart shown in FIG. 17. Initially, the code location unit 2101 reads first data of the entropy code section and outputs the maximum code length Lhmax of the Huffman code, i.e., =16 bits, from the first bit (2401).

Next, the Huffman code length detection unit 2103 obtains the Huffman code length Lh (2402). When the Huffman code length Lh is obtained, the address generation unit 2105 obtains an address to be referred to in the entropy decoding table RAM 2106 (2403). The Huffman code length detection (2402) and the address generation (2403) are carried out in one cycle.

Simultaneously, the obtained address is given to the entropy decoding table RAM 2106 (2404). Currently, the speed of the logical circuit has been increased with advances in the semiconductor process technology, but the speed of the RAM is still lower than that of the logical circuit. Therefore, it takes one cycles to give the address to the entropy decoding table RAM 2106, and one cycle to wait for output of data. The additional bit length La is obtained from the entropy decoding table RAM 2106 (2405).

Then, the code location unit 2101 performs the shift operation of the obtained additional bit length La, and locates the second Huffman code (2401). Simultaneously, the additional bit decoding unit 2107 extracts a bit string of the obtained additional bit length La from the head of the bit string which has been given by the code location unit 2101, to obtain a quantization DCT coefficient.

In order to decode the following second or later Huffman code and additional bit, the decoding process is continued from the Huffman code length detection (2402) and the address generation (2403). As can be seen in FIG. 17, the prior art Huffman decoding unit can output the quantization DCT coefficient once every four cycles.

As described above, the compressed code sequence is decompressed and decoded to obtain the restored image. However, the process of the compression coding or decompression decoding for images requires a considerably large operation amount, and it takes much time even when the special circuit shown in the above-mentioned prior art compression/decompression circuit is employed. Further, in recent years, there is a tendency that the definition in images is increased more, and a longer processing time is required.

In digital electronic circuits, in order to solve the problems in the processing time, it is common to realize speeding-up by parallelization of the circuits or the pipeline process. However, in the case of a processing including a feedback loop like decoding of variable length codes, only after the processing of one Huffman code has been finished, the decoding start position of the next Huffman code is known. Therefore, the speeding-up by the parallelization of the circuits or the pipeline processing cannot be enabled, and this causes the bottle neck in the improvement of the processing speed.

SUMMARY OF THE INVENTION

It is an object of the present invention to enable a pipeline processing in a variable length code decoding circuit, and improve the performance in the decompression decoding process time of the compression/decompression circuit.

Other objects and advantages of the present invention will become apparent from the detailed description and specific embodiments described are provided only for illustration since various additions and modifications within the spirit and scope of the invention will be apparent to those of skill in the art from the detailed description.

A decoder according to a 1st aspect of the present invention for decoding successive first and second variable length codes, with referring to a table which contains a relationship between variable length codes and decoded values comprises: a code location unit for cutting out plural bit strings from plural different relative positions with respect to a reference position; plural address candidate generation units each generating an address candidate to refer to the table for each of the plural cutout bit strings; a table reference unit for referring to the table to get decoded values on the basis of the generated address candidates; and a control unit for operating the table reference unit for the first variable length code, while simultaneously operating the address candidate generation units for the second variable length code. Therefore, while waiting for output of a decoded value from the table to decode one variable length code, table addresses for the next variable length code can be obtained by the plural address candidates generation units, whereby the pipeline processing of the decoding of the variable length codes is enabled, and the processing time can be reduced as compared to the prior art Huffman decoding unit.

According to a 2nd aspect of the present invention, the decoder of the 1st aspect comprises: a code length calculation unit for obtaining a code length of the input variable length code on the basis of a result of the table reference; and the table reference unit selects a predetermined address from the plural table reference address candidates on the basis of the obtained code length. Therefore, the location of the second variable length code can be easily performed with referring to the code length of the first variable length code.

According to a 3rd aspect of the present invention, in the decoder of the 1st aspect, the number of the address candidate generation units is less than the number of possible kinds of variable length code, and the code location unit outputs a bit string to the address candidate generation units, respectively, with successively shifting the reference position. Therefore, while waiting for output of the decoded value from the table to decode one variable length code, table addresses for the next variable length code can be obtained by the plural address candidate generation units, whereby the pipeline processing of the decoding of variable length codes is enabled. Accordingly, the processing time is reduced as compared to the prior art Huffman decoding unit, as well as the Huffman decoding unit can be realized in a smaller apparatus scale.

According to a 4the aspect of the present invention, in the decoder of the 1st aspect, the variable length code is composed of an additional bit and a secondary variable length code which is obtained by coding at least a bit length of the additional bit, and the number of the address candidate generation units is equal to the number of possible kinds of bit length of the additional bit. Therefore, while waiting for output of a decoded value from the table to decode one variable length code, table addresses for the next variable length code can be obtained by the plural address candidate generation units, whereby the pipeline processing of the decoding of variable length codes is enabled. Accordingly, the pipeline processing of the decoding of variable length codes is enabled, and the processing time is reduced as compared to the prior art Huffman decoding unit, as well as the Huffman decoding unit can be realized in a smaller apparatus scale.

According to a 5th aspect of the present invention, in the decoder of the 4the aspect, the number of the address candidate generation units is less than the number of possible kinds of bit length of the additional bit, and the code location unit outputs a bit string to the address candidate generation units, respectively, with successively shifting the reference position. Therefore, while waiting for output of a decoded value from the table to decode one variable length code, table addresses for the next variable length code can be obtained by the plural address candidates generation units, whereby the pipeline processing of the decoding of variable length codes is enabled. Accordingly, the processing time is reduced as compared to the prior art Huffman decoding unit, as well as the Huffman decoding unit can be realized in a smaller apparatus scale.

According to a 6th aspect of the present invention, the decoder of the 1st aspect comprises a decoding subunit for outputting at least a code length of a variable length code having a predetermined code length or shorter, for that variable length code. Therefore, not only the processing time is reduced as compared to the prior art Huffman decoding unit, but also the processing time can be further reduced.

A decoding method according to a 7th aspect of the present invention for decoding successive first and second variable length codes, with referring to a table which contains a relationship between variable length codes and decoded values comprises a step of simultaneously carrying out a process for referring to the table to get a decoded value for the first variable length code, and a process for generating plural table address candidates to refer to the table for the second variable length code, in parallel. Therefore, while waiting for output of a decoded value from the table to decode one variable length code, table addresses for the next variable length code can be obtained by the plural address candidates generation units, whereby the pipeline processing of the decoding of variable length codes is enabled. Accordingly, the processing time is reduced as compared to the prior art Huffman decoding unit.

According to an 8th aspect of the present invention, the decoding method of the 7th aspect comprises a step of: selecting one address from the plural table address candidates on the basis of a code length of the first variable length code obtained from a result of the table reference for the first variable length code, to locate the second variable length code. Therefore, the location of the second variable length code can be easily performed with referring to the code length of the first variable length code.

BRIEF DESCRIPTION OF THE DRAWINGS

FIG. 13 is a diagram illustrating constructions of a pattern register, a code length register, and an additional bit length register according to the fourth embodiment.

DETAILED DESCRIPTION OF THE PREFERRED EMBODIMENTS

Figure 18:
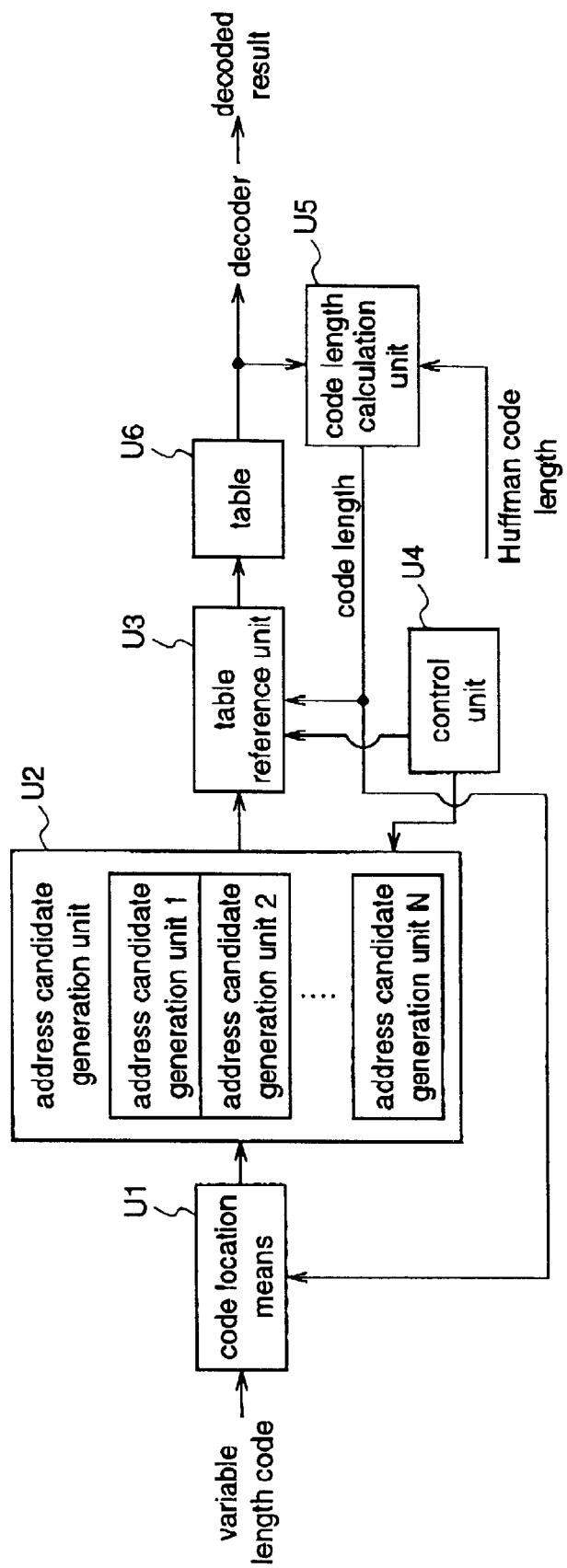
FIG. 18 is a functional block diagram illustrating a fundamental structure of a variable length code decoder according to the present invention.

Initially, a fundamental structure of a variable length code decoder according to the present invention is described. FIG. 18 is a functional block diagram illustrating the fundamental structure of a variable length code decoder of the present invention. In this figure, reference U1 denotes a code location means for cutting out plural bit strings from plural different positions with respect to a reference position. Reference U2 denotes an address candidate generation unit for generating a table reference address candidate for each of the plural cutout bit strings. Reference U3 denotes a table reference unit for referring to a predetermined variable length code decoded value from the generated address. Reference U4 denotes a control unit for operating the table reference unit U3 for a first variable length code, while simultaneously operating the address candidate generation unit U2 for a second variable length code. Reference U6 denotes a table which contains the correspondence between the codes and decoded values of the plural variable length codes. Reference U5 denotes a code length calculation unit for calculating the code length of a variable length code from a code length obtained from the Huffman code of the variable length code and the bit length of the additional bit of the variable length code. In addition, the table reference unit U3 has a function of selecting a prescribed address from the plural addresses generated by the address candidate generation unit U2 for the first variable length code, and after the code length is obtained by the code length calculation unit U5, selecting a predetermined one from the plural addresses generated by the address candidate generation unit U2 on the basis of the obtained code length Embodiment 1

Figure 1:
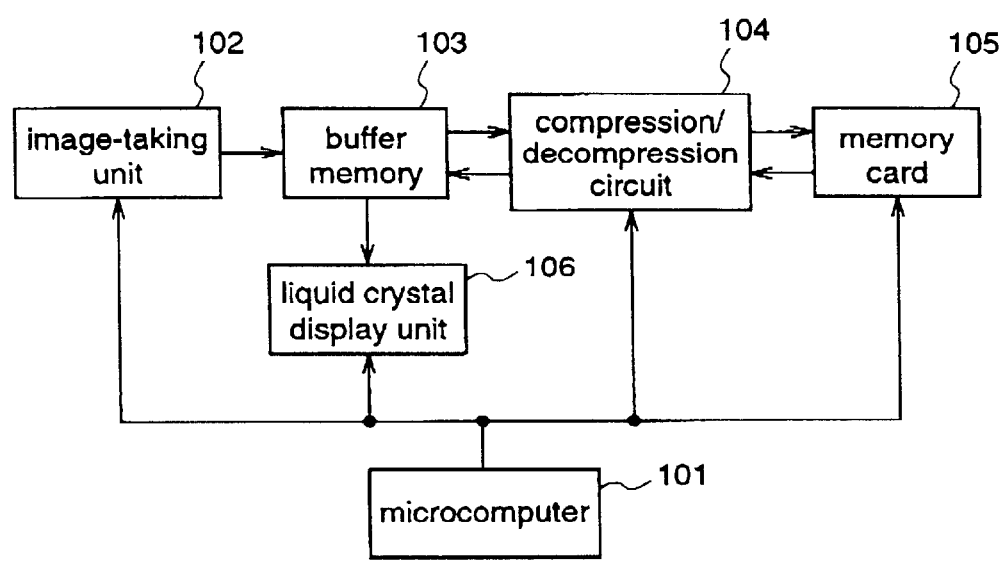
FIG. 1 is a block diagram illustrating a digital still camera according to a first embodiment of the present invention.

FIG. 1 is a block diagram illustrating a digital still camera according to the first embodiment of the present invention. The digital still camera shown in this figure comprises a microcomputer 101 for controlling the whole camera, an image-taking unit 102 for converting an image into an electrical signal by a CCD or the like, a buffer memory 103 which is constituted by a RAM for temporarily retaining image information and the like, to compressively code or decompressively decode a taken image, a compression/decompression circuit 104 for compressively coding or decompressively decoding the taken image, a memory card 105 for containing a compressed code sequence which is generated by compressively coding the taken image, and a liquid crystal display unit 106 for displaying the taken image.

Here, the decompression decoding process of the digital still camera shown in FIG. 1, according to the JPEG baseline method is described. Since the compression coding has no direct bearing on the present invention, it is not described here.

In accordance with an instruction from the microcomputer 101, a compressed code sequence is read from the memory card 105 and transmitted to the compression/decompression circuit 104. The compression/decompression circuit 104 decompressively decodes the compressed code sequence, and writes the same in the buffer memory 103 in units of a block, which is composed of 8 pixels × 8 pixels. When the decompression decoding has been finished, the microcomputer 101 instructs the buffer memory 103 and the liquid crystal display unit 106 to display the restored image, and the restored image read from the buffer memory 103 is displayed on the liquid crystal display unit 106.

Figure 2:
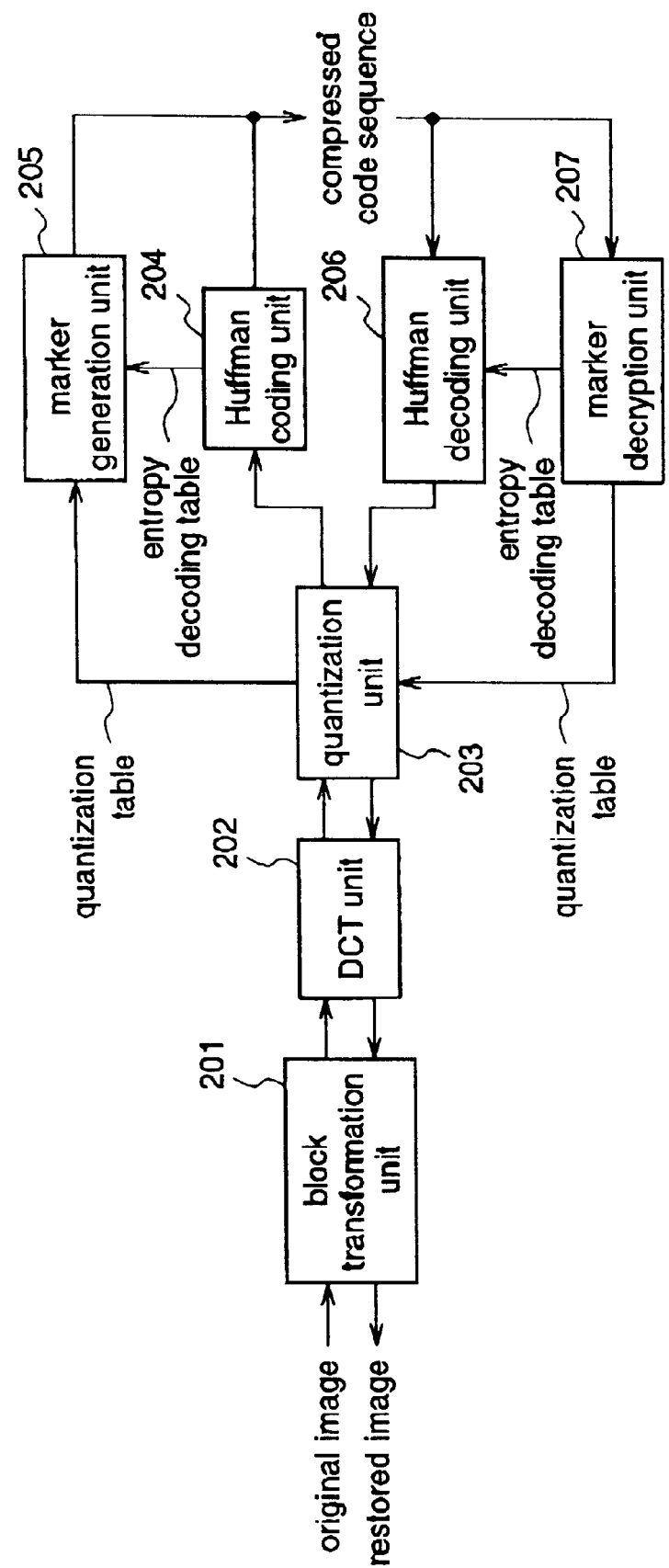
FIG. 2 is a block diagram illustrating a compression/decompression unit of the digital still camera shown in FIG. 1.
Figure 3:
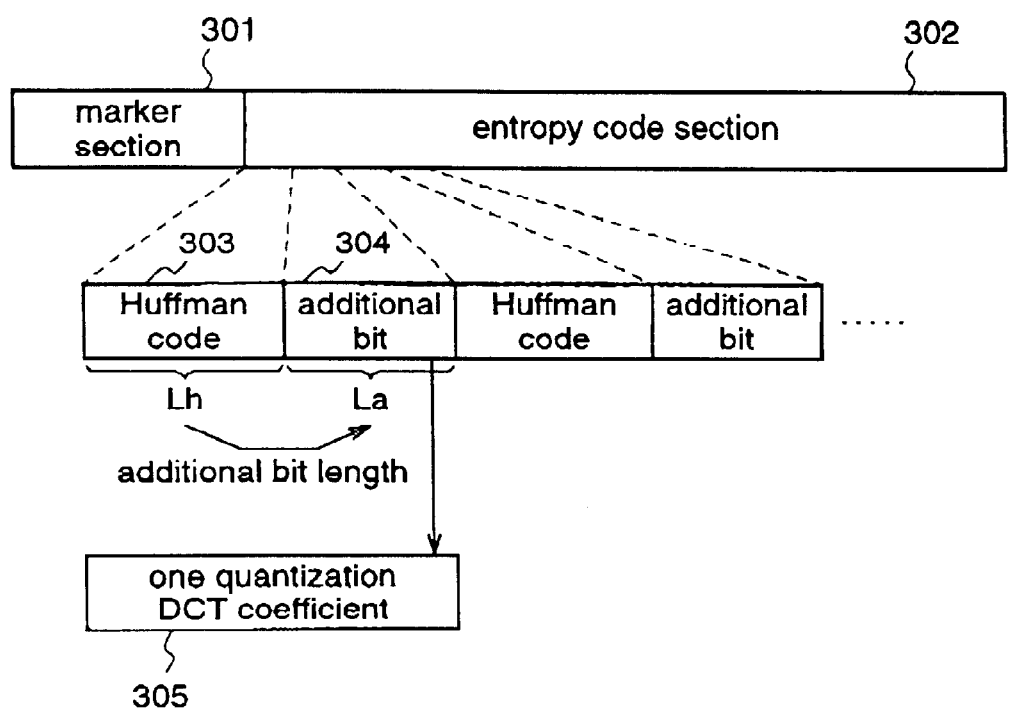
FIG. 3 is a diagram illustrating a structure of a compressed code sequence according to JPEG.

FIG. 2 is a block diagram illustrating a structure of the compression/decompression circuit 104. Since this block diagram is the same as that of the prior art compression/decompression circuit, the description is not given here.

Figure 4:
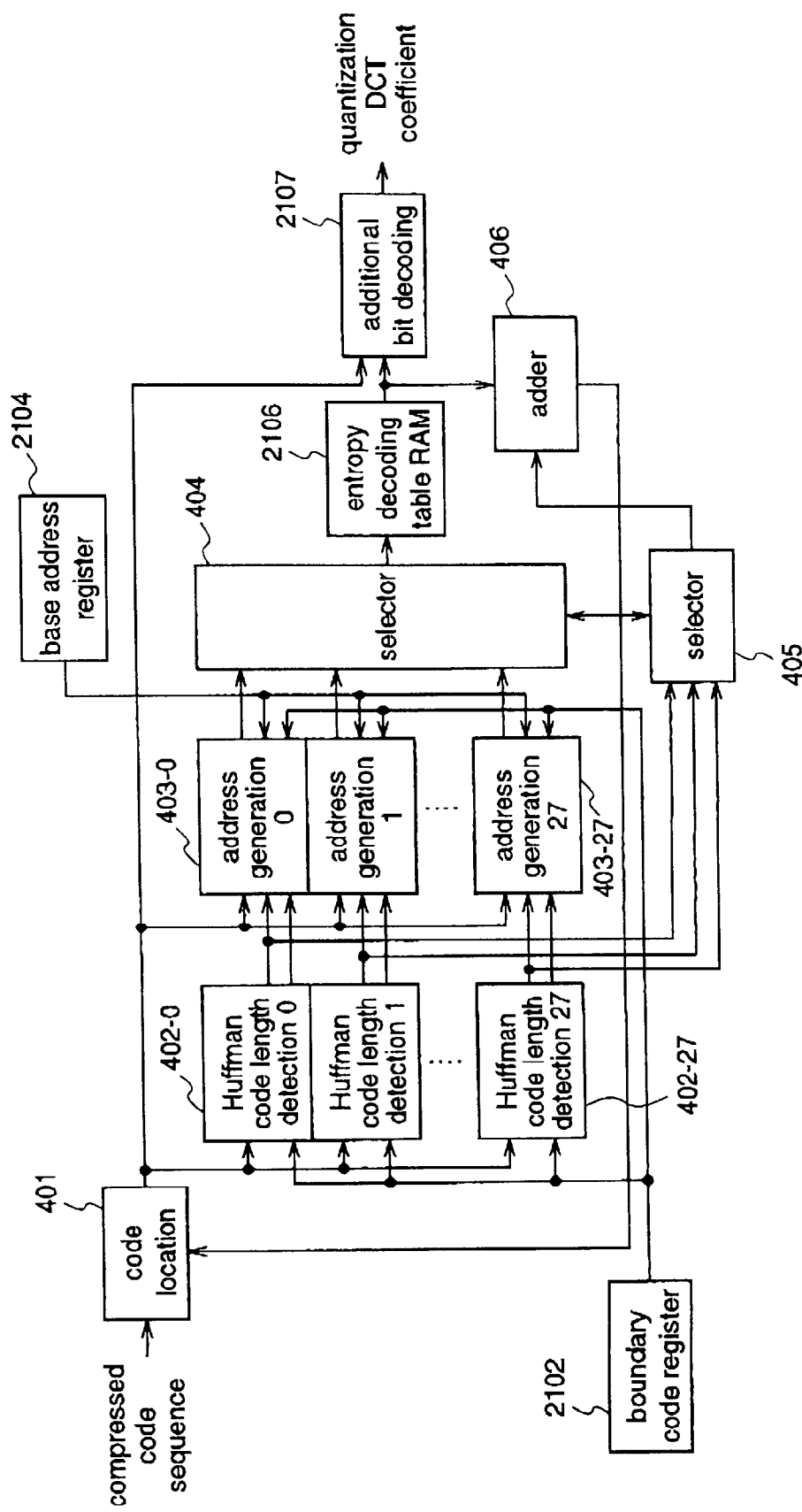
FIG. 4 is a block diagram illustrating a Huffman decoding unit according to the first embodiment.

FIG. 4 is a block diagram illustrating a Huffman decoding unit according to the first embodiment. The principle of the Huffman decoding unit according to the first embodiment is that, during an access to the entropy decoding table RAM, candidates of an entropy decoding table address for the next Huffman code are obtained, whereby parts of a series of processes relating to the entropy decoding for two Huffman codes are made overlapped, to obtain effects of the pipeline processing.

Next, the respective elements shown in FIG. 4 are described in detail. A code location unit 401 initially extracts a bit string of the maximum code length Lhmax of a Huffman code, i.e.,=16 bits, from the head of a compressed code sequence, and outputs the extracted bit string to a Huffman code length detection unit 0 (402–0). Simultaneously, the code location unit 401 extracts a bit string of Lhmax bits from the next bit but one of the head of the compressed code sequence, and outputs the extracted bit string to a Huffman code length detection unit 1 (402–1). Similarly, the unit 401 extracts a bit string of Lhmax bits from the next bit but "n" bits of the head of the compressed code sequence, and outputs the extracted bit string to a Huffman code length detection unit n (402–n). In the case of JPEG, since Lhmax=26 and Lamax=11, 28 kinds of outputs up to "n"=27 are simultaneously carried out. Further, when the code length (Lh+La) is obtained by an adder 406, the code location unit 401 performs the shift operation of (Lh+La) bits, obtains the next data from the compressed code sequence as required, and locates the additional bit.

The boundary code register 2102 is the same as that in the prior art Huffman decoding unit.

The Huffman code length detection units 0 (402–0)~27 (402–27) are obtained by merely providing (Lhmax+Lamax) of the same Huffman code length detection units as that in the prior art Huffman decoding unit, and each of the Huffman code length detection units is the same as that of the prior art Huffman decoding unit.

The base address register 2104 is the same as that in the prior art Huffman decoding unit.

Address generation units 0 (403–0)~27 (403–27) are obtained by merely providing (Lhmax+Lamax) of the same address generation units as that in the prior art Huffman decoding unit, and each of the address generation units is the same as that in the prior art Huffman decoding unit.

A selector 404 selects an address which is input from the address generation unit 0 (403–0) at entropy decoding of the first Huffman code to output the selected address to the entropy decoding table RAM 2106, and selects an address which is output by the address generation unit n (403–n) corresponding to the output of the adder 406 at entropy decoding of the second or later Huffman code to output the selected address to the entropy decoding table RAM 2106.

A selector 405 selects a code length which is input from the Huffman code length detection unit 0 (402–0) at the entropy decoding of the first Huffman code, to output the selected code length to the adder 406 as the Huffman code length Lh, and selects a Huffman code length which is output by the Huffman code length detection unit n (402–n) corresponding to the output of the adder 406 at the entropy decoding of the second or later Huffman code, to output the selected code length to the adder 406.

The entropy decoding table RAM 2106 is the same as the entropy decoding table RAM of the prior art Huffman decoding unit.

The adder 406 adds the Huffman code length Lh output from the selector 405 and the additional big length La output from the entropy decoding table RAM 2106, to obtain a code length (Lh+La).

The additional bit decoding unit 2107 is the same as the additional bit decoding unit of the prior art Huffman decoding unit.

Figure 5:
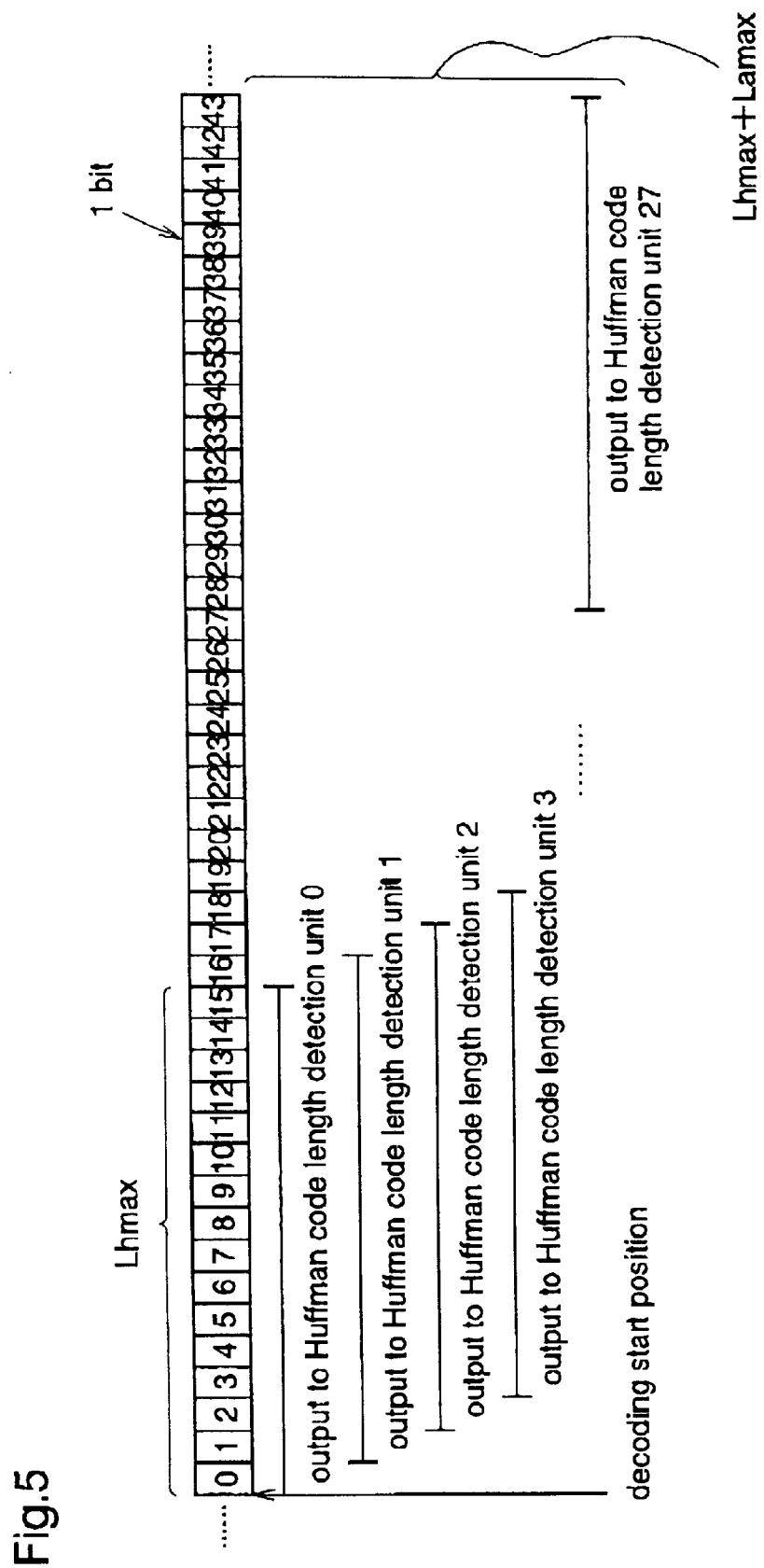
FIG. 5 is a diagram showing a manner in which a compressed code sequence is input to a Huffman code length detection unit according to the first embodiment.

FIG. 5 is a diagram showing the relationship of the bit strings which are output from the code location unit 401 to the Huffman code length detection units 0 (402–0)~27 (402-14 27) and the address generation units 0 (403–0)~27 (403–27). Though not shown in the figure, the same bit string is input to the Huffman code length detection unit 0 (402–0) and the address generation unit 0 (403–0). Similarly, the same bit string is input to the Huffman code length detection unit n (402–n) and the address generation unit n (403–n).

The operation of the above-mentioned Huffman decoding unit according to the first embodiment is described with reference to a timing chart shown in FIG. 6.

(1.1. Step 1)

Initially, the code location unit 401 sets the decoding start position at the first bit of the entropy code section. Further, the unit 401 reads first data of the entropy code section and outputs big string of the maximum code length Lhmax of the Huffman code, i.e.,=16 bits, to the Huffman code length detection units 0 (402–0)~27 (402–27) and the address generation units 0 (403–0)~27 (403–27) (601).

(1.2. Step 2)

Next, each of the Huffman code length detection units 0 (402–0)~27 (402–27) assumes that the Huffman code exists from the head of the input bit string, and detects the Huffman code length (602). When the Huffman code length is obtained, the address generation units 0 (403–0)~27 (403–27) obtain an address to be referred in the entropy decoding table RAM 2106, respectively (603). The Huffman code length detection (602) and the address generation (603) are carried out in one cycle, like in the prior art Huffman decoding unit.

(1.3. Step 3)

Next, the selector 404 selects the address which is output by the address generation unit 0 (403–0) at the entropy decoding of the first Huffman code, without reservation.

The selected address is given to the entropy decoding table RAM 2106 (604). For the same reason as in the case of the prior art Huffman decoding unit, it takes one cycle to give the address to the entropy decoding table RAM 2106, and one cycle to wait for the output of data.

(1.4. Step 4)

It is in a stage of waiting for the output of the additional big length La from the entropy decoding table RAM 2106, and the output is determined during this cycle (605).

In parallel with this, the Huffman code length detection units 0 (402–0)~27 (402–27) obtain the Huffman code length of the second Huffman code. Since the total bit length Lh+La) of the first Huffman code and the additional bit is unknown at this time, candidates of the code length Lh of the second Huffman code are obtained to suit all cases of a possible range of (Lh+La) (602). Simultaneously, the address generation units 0 (403–0)~27 (403–27) obtain candidates of the entropy decoding table address for the second Huffman code (603).

(1.5. Step 5)

The selector 404 selects an address corresponding to the code length (Lh+La) which is output by the adder 406, from obtained (Lhmax+Lamax) addresses for the second Huffman code, and outputs the selected address to the entropy decoding table RAM 2106 (604).

Simultaneously, the selector 405 selects a Huffman code length corresponding to the code length (Lh+La) which is output by the adder 406, from the obtained (Lhmax+Lamax) Huffman code lengths for the second Huffman code, and outputs the selected Huffman code length to the adder 406. However, before the bit length La of the additional bit subsequent to the first Huffman code is obtained, the selector 405 selects the Huffman code length which is output by the Huffman code length detection unit 0 (402–0). Simultaneously, the adder 406 adds the Huffman code length Lh selected by the selector 405 and the additional bit length La obtained from the entropy decoding table RAM 2106, to obtain the code length Lh+La (606).

Simultaneously, the code location unit 401 performs the shift operation of the obtained code length (Lh+La), and locates the second Huffman code (601).

The operation of the additional bit decoding unit 2107 for simultaneously outputting the quantization DCT coefficient is the same as that of the prior art Huffman decoding unit. (1.6. Step 6 and later)

Hereinafter, steps 4 and 5 are repeated.

Figure 6:
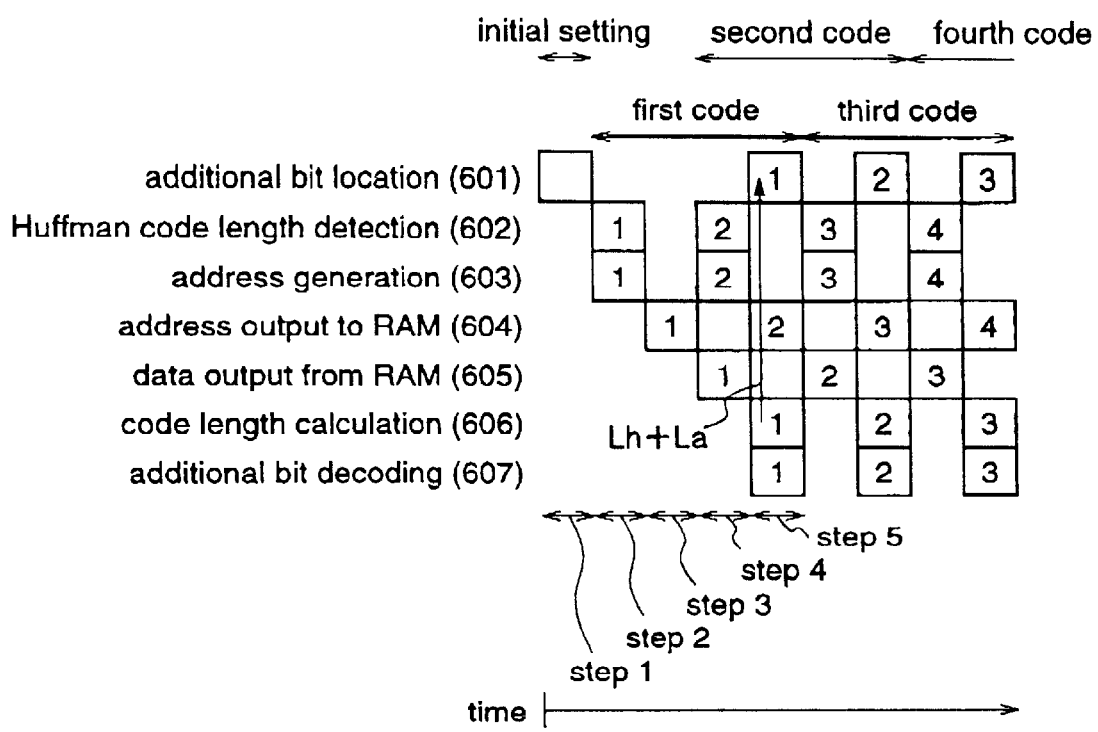
FIG. 6 is a diagram showing a timing chart of the Huffman decoding unit of the first embodiment.

As can be seen in FIG. 6, according to the first embodiment, the quantization DCT coefficient can be output once every two cycles. As described above, the (Lhmax+Lamax) Huffman code length detection units and the (Lhmax+Lamax) address generation units are provided, (Lhmax+Lamax) being the total length of the maximum code length of the Huffman code and the maximum bit length of the additional bit, and the selectors select the outputs, whereby the quantization DCT coefficients twice as many as in the case of the prior art Huffman decoding unit can be obtained during the same time.

In this first embodiment, in order to obtain the candidates of the Huffman code length and the candidates of the address, the numbers of which candidates are both the same as the total length of the maximum length (Lhmax) of the Huffman code and the maximum length (Lamax) of the additional bit, the (Lhmax+Lamax) Huffman code length detection units and the (Lhmax+Lamax) address generation units are provided. However, when the processes by the Huffman code length detection unit and the address generation unit require only quite a short time as compared to one cycle, the same effects can be obtained by repeating the processes (Lhmax+Lamax) times in one cycle by one Huffman code length detection unit and one address generation unit. Further, the same effects can be also obtained by repeating the processes plural times in one cycle by plural (two or more, and less than Lhmax+Lamax) Huffman code length detection units and plural address generation units.

Conversely, when the processes by the Huffman code length detection unit and the address generation unit cannot be carried out in one cycle, it is also possible to carry out the processes by the Huffman code length detection unit and the address generation unit in two or more cycles.

In this first embodiment, the Discrete Cosine transformation is used as the orthogonal transformation. However, in applications other than JPEG, the Discrete Sine transformation, the Walsh-Hadamard transformation, the Wavelet transformation and the like can be used.

Further, in this first embodiment, the Huffman coding is used as the entropy coding, while the arithmetic coding and the like can be used in the applications including those other than JPEG. Particularly, the effects can be obtained in the entropy coding which can obtain the code length of the variable length code only with referring to the entropy decoding table RAM.

This first embodiment is described assuming that this is applied to JPEG, while this can be also applied to MPEG. In the case of MPEG, the additional bit in this first embodiment corresponds to a fixed length code subsequent to an escape code. Since the bit length of the fixed length code in MPEG is fixed in one kind, the candidates of the address obtained by the address generation units are following two: an address in a case where the escape code is detected and this is followed by a fixed length code, and an address in a case where a variable length code other than the escape code is detected and this is not followed by a fixed length code. Also in MPEG, the above-mentioned effects can be obtained, by providing two Huffman code length detection units and two address generation units, and controlling the selectors 404 and 405 on the basis of whether the escape code is detected or not.

The entropy code section according to JPEG as shown in this first embodiment is composed of Huffman codes and following additional bits. Further, the code length of the Huffman code can be also obtained by the Huffman code length detection units 0 (402-1)-27 (402-27). However, in cases of using common variable length codes, other than JPEG, the code length cannot always be obtained easily by means like the Huffman code length detection unit, and further the additional bit may not exist. Also in this case, when the code length of a variable length code corresponding to the Huffman code of the first embodiment is obtained with referring to the entropy decoding table RAM, the same effects can be obtained.

Further, since this first embodiment pertains directly to the decoding of variable length codes, this can be applied not only in cases where images according to JPEG, MPEG or the like are handled but also generally to a decoder of variable length codes, and the same effects can be obtained.

Embodiment 2

Another example of the Huffman decoding unit 206 shown in FIG. 2 of the compression/decompression circuit 104 included in the digital still camera shown in FIG. 1 will be described in the second embodiment with reference to the drawings.

Figure 7:
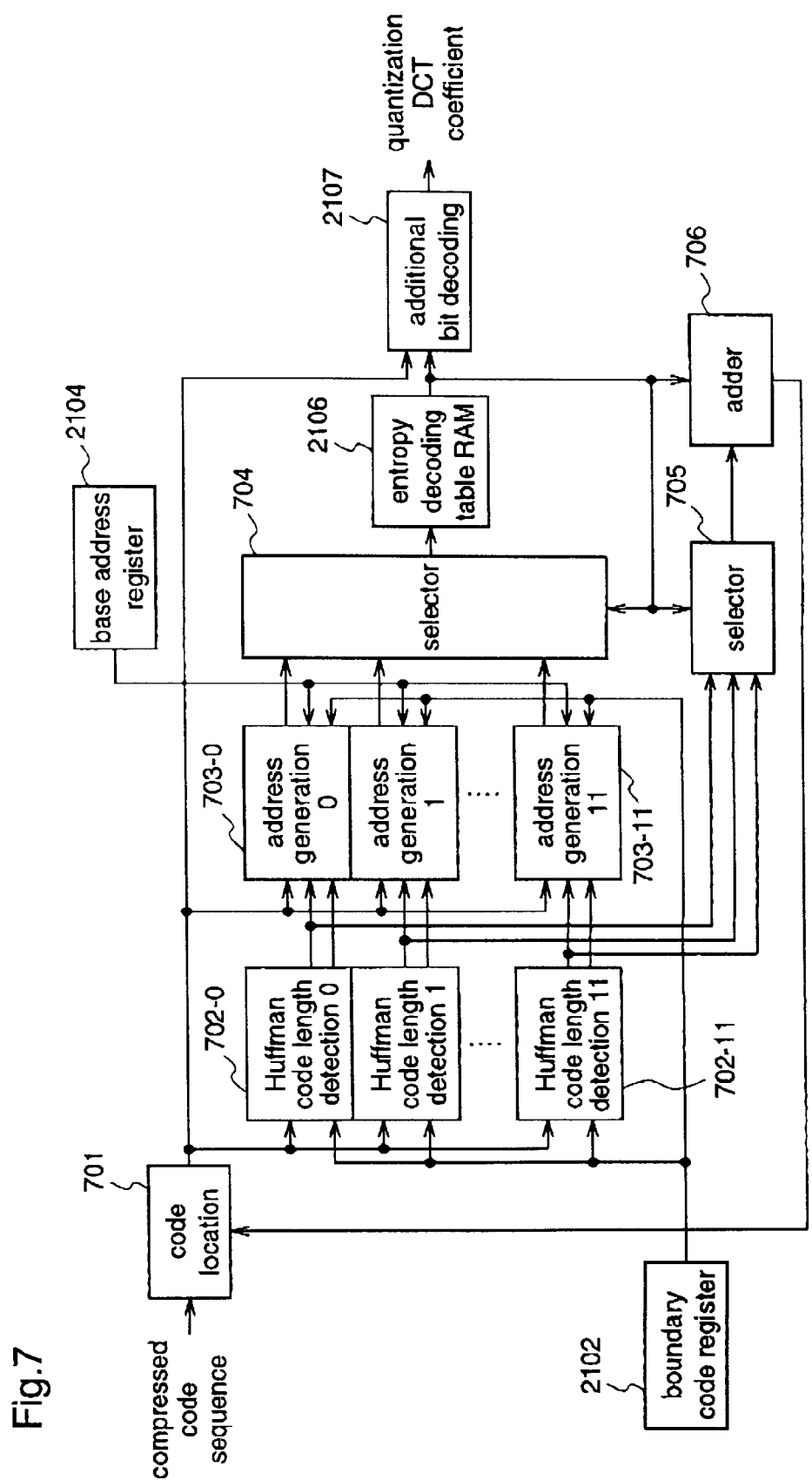
FIG. 7 is a block diagram illustrating a Huffman decoding unit according to a second embodiment of the present invention.

FIG. 7 is a block diagram illustrating a Huffman decoding unit 206 according to the second embodiment. In FIG. 7, the same reference numerals as those in the prior art Huffman decoding unit or the Huffman decoding unit of the first embodiment denote the same or corresponding elements.

The principle of the Huffman decoding unit according to the second embodiment is that when the compressed code is composed of combination of variable length codes and additional bits whose bit length is defined on the basis of the result of entropy decoding of the variable length code, and the code length of the variable length code is obtained without waiting for the output from the entropy decoding table RAM, the number of candidates of the entropy decoding table address for the next Huffman code, which are obtained during the access to the entropy decoding table RAM, can be reduced to a number which is equal to the bit length of the additional bit, thereby realizing the Huffman decoding unit in a smaller apparatus scale with obtaining the effects of the pipeline processing as in the first embodiment.

Next, the respective elements shown in FIG. 7 are described in detail. A code location unit 701 initially extracts a bit string of the maximum code length Lhmax of the Huffman code, i.e.,=16 bits, from the head of a compressed code sequence, and outputs the bit string to a Huffman code length detection unit 0 (702-0). Simultaneously, the unit 701 extracts a bit string of Lhmax bits from the next bit but one of the head of the compressed code sequence, and outputs the bit string to the Huffman code length detection unit 1 (702-1). Similarly, the unit 701 extracts a bit string of Lhmax bits from the next bit but "n" bits of the head of the compressed code sequence, and outputs the bit string to the Huffman code length detection unit n (702-n). In the case of JPEG, since Lamax=11, 12 kinds of output up to "n"=11 are simultaneously performed. Further, when the sum of the bit length La' of an additional bit subsequent to a Huffman code which has been entropy-decoded immediately before and the code length Lh of a Huffman code which is now being decoded, i.e., La'+Lh, is obtained from an adder 706, the code location unit 701 performs the shift operation of (La'+Lh) bits, obtains the next data from the compressed code sequence as required, and locates the additional bit.

The boundary code register 2102 is the same as that in the prior art Huffman decoding unit.

The Huffman code length detection units 0 (702-0)~11 (702-11) are obtained by merely providing (Lamax) of the same Huffman code length detection units as that of the prior art Huffman decoding unit, and each of the Huffman code length detection units are the same as that in the prior art Huffman decoding unit.

The base address register 2104 is the same as that in the prior art Huffman decoding unit.

Address generation units 0 (703-0)~11 (703-11) are obtained by merely providing (Lamax) of the same address generation units as that of the prior art Huffman decoding unit, and each of the address generation units is the same as that in the prior art Huffman decoding unit.

A selector 704 selects an address which is input from the address generation unit 0 (703-0) at the entropy decoding of the first Huffman code, to output the selected address to the entropy decoding table RAM 2106, and selects an address which is output by the address generation unit n (703-n) corresponding to an additional bit length La' output from the entropy decoding table RAM 2106 at the entropy decoding of the second or later Huffman code, to output the selected address to the entropy decoding table RAM 2106.

A selector 705 selects a code length which is input from the Huffman code length detection unit 0 (702-0) at the entropy decoding of the first Huffman code, to output the selected code length to the adder 706 as the Huffman code length Lh, and selects a Huffman code length Lh which is output by the Huffman code length detection unit n (702-n) corresponding to an additional bit length La' output from the entropy decoding table RAM 2106 at the entropy decoding of the second or later Huffman code, to output the selected Huffman code length to the adder 706.

The entropy decoding table RAM 2106 is the same as the entropy decoding table RAM of the prior art Huffman decoding unit.

The adder 706 adds the additional bit length La' of the Huffman code which has been entropy-decoded immediately before, output from the entropy decoding table RAM 2106, and the Huffman code length Lh output by the selector 705, to obtain La'+Lh.

The additional bit decoding unit 2107 is the same as the additional bit decoding unit of the prior art Huffman decoding unit.

Figure 8:
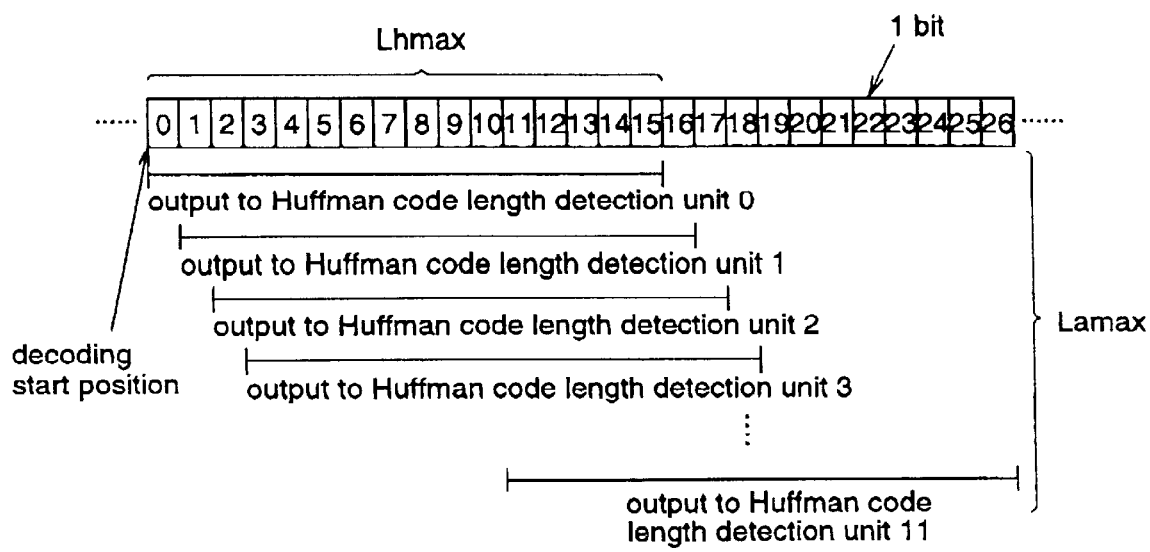
FIG. 8 is a diagram showing a manner in which a compressed code sequence is input to a Huffman code length detection unit according to the second embodiment.

FIG. 8 shows the relationship of bit strings which are output from the code location unit 701 to the Huffman code length detection units 0 (702-0)~11 (702-11) and the address generation units 0 (703-0)~11 (703-11). Though not shown in FIG. 8, the same bit string is input to the Huffman code length detection unit n (702-n) and the address generation unit n (703-n), as in the first embodiment.

The operation of the above-mentioned Huffman decoding unit according to the second embodiment is described with reference to a timing chart shown in FIG. 9.

(2.1. Step 1)

Initially, the code location unit 701 sets the decoding start position at the first bit of the entropy code section. Further, it reads first data of the entropy code section, and outputs a bit string of the maximum code length Lhmax of the Huffman code, i.e., =16 bits, to the Huffman code length detection units 0 (702-0)~11 (702-11) and the address generation units 0 (703-0)~11 (703-11) (901).

(2.2. Step 2)

Next, the Huffman code length detection units 0 (702-0)~11 (702-11) assume that the Huffman code exists from the head of the input bit string, and detect the Huffman code length, respectively, (902). When the Huffman code length is obtained, the address generation units 0 (703-0)~11 (703-11) obtain an address to be referred to in the entropy decoding table RAM 2106, respectively (903). The Huffman code length detection (902) and the address generation (903) are performed in one cycle as in the prior art Huffman decoding unit.

(2.3. Step 3)

The selector 704 selects the address output by the address generation unit 0 (703-0) at the entropy decoding of the first Huffman code, without reservation.

Next, the selected address is given to the entropy decoding table RAM 2106 (904). For the same reason as in the case of the prior art Huffman decoding unit, it takes one cycle to give the address to the entropy decoding table RAM 2106 and one cycle to wait for the output of data.

(2.4. Step 4)

It is in a stage of waiting for output of the additional bit length La from the entropy decoding table RAM 2016, and the output is determined during this cycle (905).

In parallel with this, the Huffman code length detection units 0 (702-0)~11 (702-11) obtain the Huffman code length of the second Huffman code, respectively. Since the bit length La of the additional bit subsequent to the first Huffman code is unknown at this time, candidates of a code length Lh of the second Huffman code are obtained to suit all cases of a possible value range of La (902). Simultaneously, the address generation units 0 (703-0)~11 (703-11) obtain candidates of an entropy decoding table address for the second Huffman code (903).

(2.5. Step 5)

The selector 704 selects an address corresponding to La' which is output by the entropy decoding table RAM 2106, from the obtained Lamax addresses for the second Huffman code, and outputs the selected address to the entropy decoding table RAM 2106 (904). Simultaneously, the selector 705 selects a Huffman code corresponding to the code length which is output by the entropy decoding table RAM 2106, from the obtained Lamax Huffman code lengths for the second Huffman code, and outputs the selected Huffman code to the adder 706 as the Huffman code length Lh. However, until the bit length La' of the additional bit subsequent to the first Huffman code is obtained, the selector 705 selects the Huffman code length output by the Huffman code length detection unit 0 (702-0).

Simultaneously, the adder 706 adds the additional bit length La' obtained from the entropy decoding table RAM 2106 and the Huffman code length Lh selected by the selector 705, to obtain La'+Lh. Simultaneously, the code location unit 701 performs the shift operation of obtained (La'+Lh) bits, and locates the additional bit subsequent the Huffman code which is being decoded (901).

Simultaneously, the additional bit decoding unit 2107 extracts the additional bit length La obtained by the entropy decoding table RAM 2106 from the head of the bit string output by the code location unit 701, and outputs the bit length as the quantization DCT coefficient (906). This operation is the same as that of the prior art Huffman decoding unit.

(2.6. Step 5 and later)

Hereinafter, steps 4 and 5 are repeated.

Figure 9:
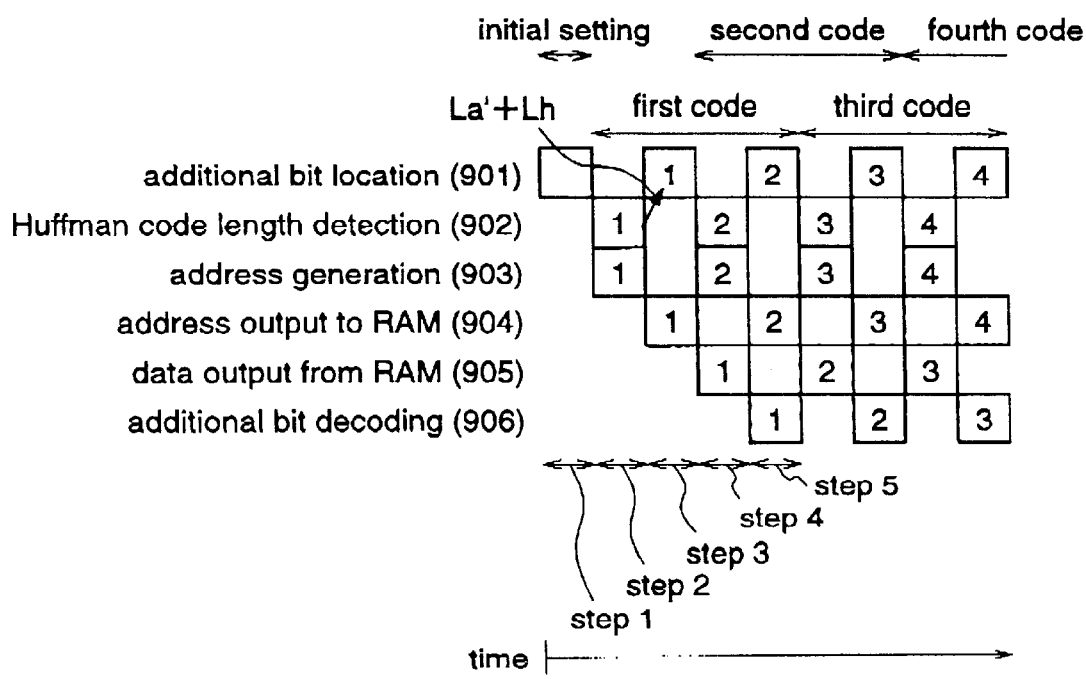
FIG. 9 is a diagram showing a timing chart of the Huffman decoding unit of the second embodiment.

In this second embodiment, as can be seen in FIG. 9, the quantization DCT coefficient can be output once every two cycles, like in the first embodiment. Further, as can be seen in FIG. 7, since it is enough to provide Lamax Huffman code length detection units and Lamax address generation units, the Huffman decoding unit can be packaged in a smaller circuit scale than that of the first embodiment.

As described above, since the Lamax Huffman code length detection units and the Lamax address generation units, Lamax being the maximum bit length of the additional bit, are provided and the selector selects one of their outputs, the quantization DCT coefficients twice as many as those in the prior art Huffman decoding unit can be obtained in the same time period.

In this second embodiment, the Lamax Huffman code length detection units and the Lamax address generation units are provided to obtain Lamax kinds of Huffman code length candidate and Lamax kinds of address candidate, Lamax being equal to the additional bit length. However, when the processes by the Huffman code length detection units and the address generation units require quite a shorter time than one cycle and there is a sufficient time left, the same effects can be obtained by repeating the processes Lamax times in one cycle by one Huffman code length detection unit and one address generation unit. Further, the same effects can be also obtained by repeating the processes plural times in one cycle by plural (two or more, and less than Lamax) Huffman code length detection units and address generation units.

This second embodiment is described assuming that this is applied to JPEG as in the first embodiment, while this can be also applied to MPEG by the processing like in the first embodiment.

Further, since this second embodiment also pertains directly to the decoding of variable length codes, this second embodiment can be applied not only in cases where images according to JPEG or MPEG are handled but also generally to a decoder of variable length codes, like the first embodiment, and the same effects can be obtained.

Embodiment 3

Another example of the Huffman decoding unit 206 in FIG. 2 of the compression/decompression circuit 104 included in the digital still camera shown in FIG. 1 is described as the third embodiment with reference to the drawings.

Figure 10:
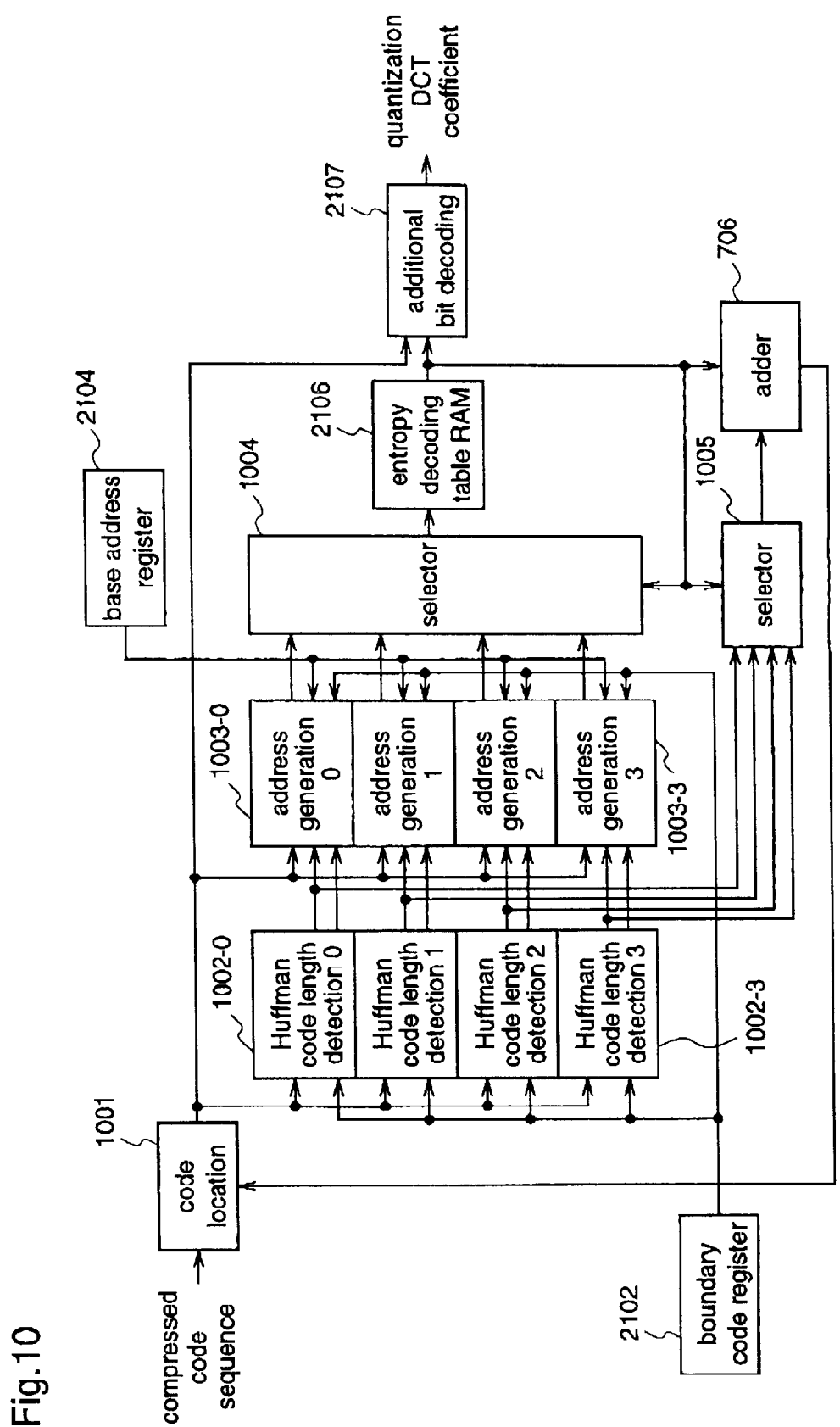
FIG. 10 is a block diagram illustrating a Huffman decoding unit according to a third embodiment of the present invention.

FIG. 10 is a block diagram illustrating a Huffman decoding unit 206 according to the third embodiment. In FIG. 10, the same reference numerals as those in any of the prior art Huffman decoding unit, the Huffman decoding unit of the first embodiment and the Huffman decoding unit of the second embodiment denote the same or corresponding elements.

The principle of the Huffman decoding unit according to the third embodiment is as follows: Even when a variable length code or additional bit having a longer bit length is entropy-decoded more slowly than a variable length code or additional bit having a shorter bit length, the reduction in the process speed performance is small. Therefore, the number of candidates of the entropy decoding table address for the next Huffman code, which are obtained during the access to the entropy decoding table RAM, is reduced as compared to that in the first or second embodiment, to realize the Huffman decoding unit in a much smaller apparatus scale.

Next, the respective elements in FIG. 10 are described in detail. A code location unit 1001 initially extracts a bit string of Lhmax bits from the next bit but "n" bits of the head of the compressed code sequence, and outputs the bit string to a Huffman code length detection unit n (1001-n). When La'+Lh is obtained by an adder 706, the code location unit 1001 performs the shift operation of (La'+Lh) bits, obtains the next data from the compressed code sequence as required, and locates the additional bit.

The code location unit 1001 is different from the code location unit of the second embodiment in that the unit 1001 performs the output of less than the maximum bit length Lamax (4 in the third embodiment shown in FIG. 10, hereinafter referred to as Nh) of the additional bit, and in that when the additional bit length La' of the Huffman code which has been entropy-decoded immediately before (described later) is longer than Nh, it performs the shift operation of La' bits, locates the next Huffman code, extracts a bit string of Lhmax bits, and outputs the bit string again to the Huffman code length detection unit 0 (1002-0) and the address generation unit 0 (1003-0), The boundary code register 2102 is the same as that in the prior art Huffman decoding unit.

The Huffman code length detection units 0 (1002-0)~3 (1002-3) are obtained by merely providing Nh of the same Huffman code length detection units as that in the prior art Huffman decoding unit, and each of the Huffman code length detection units is the same as that in the prior art Huffman decoding unit.

The base address register 2104 is the same as that in the prior art Huffman decoding unit.

The address generation units 0 (1003-0)~3 (1003-3) are obtained by merely providing Nh of the same address generation units as that in the prior art Huffman decoding unit, and each of the address generation units is the same as that in the prior art Huffman decoding unit.

A selector 1004 selects an address which is input from the address generation unit 0 (1003-0) at the entropy decoding of the first Huffman code, to output the selected address to the entropy decoding table RAM 2106, and selects an address output by the address generation unit n (1003-n) corresponding to an additional bit length La' which is output from the entropy decoding table RAM 2106 at the entropy decoding of the second or later Huffman code, to output the selected address to the entropy decoding table RAM 2106.

A selector 1005 selects a code length which is input from the Huffman code length detection unit 0 (1002-0) at the entropy decoding of the first Huffman code, to output the selected code length to the adder 706 as the Huffman code length Lh, and selects a Huffman code length Lh output by the Huffman code length generation unit n (1002-n) corresponding to an additional bit length La' which is output from the entropy decoding table RAM 2106 at the entropy decoding of the second or later Huffman code, to output the selected code length to the adder 706. Further, when the La' is equal to or larger than Nh, a value "0" is output to the adder 706, because no candidate of the Huffman code length corresponding to La' is obtained.

The entropy decoding table RAM 2106 is the same as the entropy decoding table RAM of the prior art Huffman decoding unit.

The adder 706 is the same as that in the second embodiment.

The additional bit decoding unit 2107 is the same as the additional bit decoding unit of the prior art Huffman decoding unit.

The operation of the above-mentioned Huffman decoding unit according to the third embodiment is described with reference to a timing chart shown in FIG. 11.

(3.1. Step 1)

Initially, the code location unit 1001 sets the decoding start position at the first bit of the entropy code section. Further, the code location unit 1001 reads first data of the entropy code section, and outputs a bit string of the maximum code length Lhmax of the Huffman code, i.e., =16 bits, to the Huffman code length detection units 0 (1002-0)~3

(1002-3) and the address generation units 0 (1003-0)~3 (1003-3) (1101). This is the same as 901 in the second embodiment, except for the fact that the kinds of output bit strings are reduced to Nh kinds.

(3.2. Step 2)

Next, the Huffman code length detection units 0 (1002-0)~3 (1002-3) assume that the Huffman code exists from the head of the input bit string, and detect the Huffman code length, respectively (1102). When the Huffman code length is obtained, the address generation units 0 (1003-0)~3 (1003-3) obtain an address to be referred to in the entropy decoding table RAM 2106, respectively (1103).

(3.3. Step 3)

The selector 1004 selects an address output by the address generation unit 0 (1003-0) at the entropy decoding of the first Huffman code, without reservation.

Next, the selected address is given to the entropy decoding table RAM 2106 (1104), and the processes until the additional bit length La is obtained are the same as those in the first embodiment.

(3.4. Step 4)

It is in a stage for waiting for the output of the additional bit length La from the entropy decoding table RAM 2106, and the output is determined during this cycle (1105).

In parallel with this, the process for obtaining the Huffman code length of the second Huffman code by the Huffman code length detection units 0 (1002-0)~3 (1002-3) (1102) and the process for simultaneously obtaining the candidates of the entropy decoding table address for the second Huffman code by the address generation units 0 (1003-0)~3 (1003-3) (1103) are carried out, which are the same as those in the second embodiment.

(3.5. Step 5)

Figure 11:
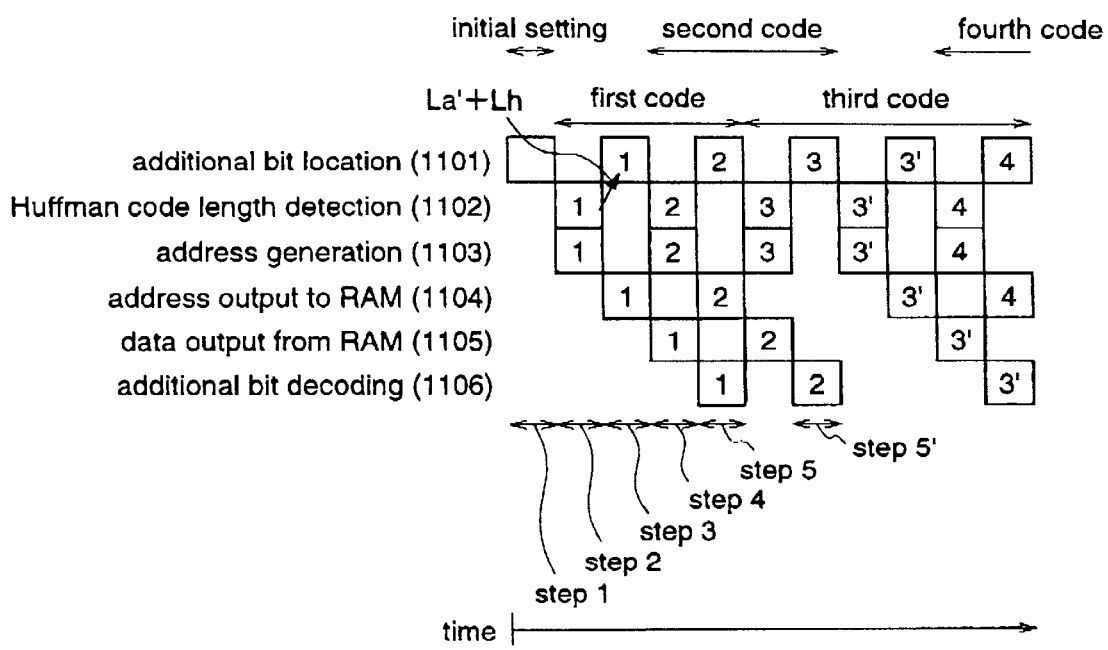
FIG. 11 is a diagram showing a timing chart of the Huffman decoding unit of the third embodiment.

In the example shown in FIG. 11, the process of step 5 is executed for the first code and the second code.

When there is an address corresponding to La' in the obtained Lh addresses for the second Huffman code, the selector 1004 selects that address to output the same to the entropy decoding table RAM 2106 (1104), and the selector 1005 selects a Huffman code length corresponding to the additional bit length La' output by the entropy decoding table RAM 2106, from the obtained Lamax Huffman code lengths for the second Huffman code to output the same to the adder 706 as the Huffman code length Lh, which is the same as that in the second embodiment. The Huffman code length which is output by the Huffman code length detection unit 0 (1002-0) is selected until the bit length La' of the additional bit subsequent to the first Huffman code is obtained, which is also the same as the second embodiment.

Simultaneously, the adder 706 adds the additional bit length La' obtained from the entropy decoding table RAM 2106 and the Huffman code length Lh selected by the selector 1105 to obtain La'+Lh, and the code location unit 1001 performs the shift operation of obtained (La'+Lh) bits, locates the additional bit subsequent to the Huffman code which is being decoded (1101), and the additional bit decoding unit 2107 extracts bits of the additional bit length La' obtained from the entropy decoding table RAM 2106, from the head of the bit string which is output by the code location unit 1001 to output the same as the quantization DCT coefficient (1106), which is also the same as the same embodiment.

The next step is step 4, which is also the same as the second embodiment.

(3.6. Step 5')

In the example shown in FIG. 11, the process of step 5' is executed for the third code.

When there is no address corresponding to (La'+Lh) in Nh addresses for the third Huffman code, the Huffman code length and the entropy decoding table address are re-calculated in the next cycle. Since the value of La' is determined in this step, the code location unit 1001 prepares to output a bit string of a bit length Lhmax, from La' bits behind the present decoding start position, to the Huffman code length detection unit 0 (1002-0) and the address generation unit 0 (1003-0) in the next cycle. To be more specific, not the additional bit which is subsequent to the immediately preceding Huffman code but the Huffman code which is being entropy-decoded is located. In a sense that the Huffman code is located, this process is the same as the code location (1101) in Step 1. From the next cycle, the entropy decoding of this Huffman code is reliably enabled by the Huffman code length detection 0 (1002-0) and the address generation unit 0 (1003-0). The following step is Step 2.

In this third embodiment, as can be seen in FIG. 10, since it is enough to provide the Nh Huffman code length detection units and the Nh address generation units, the Huffman decoding unit can be packaged in a smaller circuit scale than that in the second embodiment. Further, when the bit length of the additional bit is shorter than Nh bits, the quantization DCT coefficient can be output once every two cycles, like in the first or second embodiment. When the additional bit length is equal to or longer than Nh bits, it takes more cycles to output the quantization DCT coefficient, while in this case the reduction in the processing speed is only small as a whole, because more bits are processed in one time.

Also in this third embodiment, like in the second embodiment, when the processes by the Huffman code length detection units and the address generation units require quite a shorter time than one cycle and there is a sufficient time left, the same effects can be obtained by repeating the processes Nh times by one Huffman code length detection unit and one address generation unit, in place of providing Nh Huffman code length detection units and Nh address generation units to obtain Nh Huffman code length candidates and Nh address candidates in one cycle. Further, the same effects can be also obtained by repeating the process plural times by plural (two or more, and less than Nh) Huffman code length detection units and plural address generation units.

Embodiment 4

Another example of the Huffman decoding unit 206 in FIG. 2 of the compression/decompression circuit 104 included in the digital still camera shown in FIG. 1 is described as the fourth embodiment with reference to the drawings.

Figure 12:
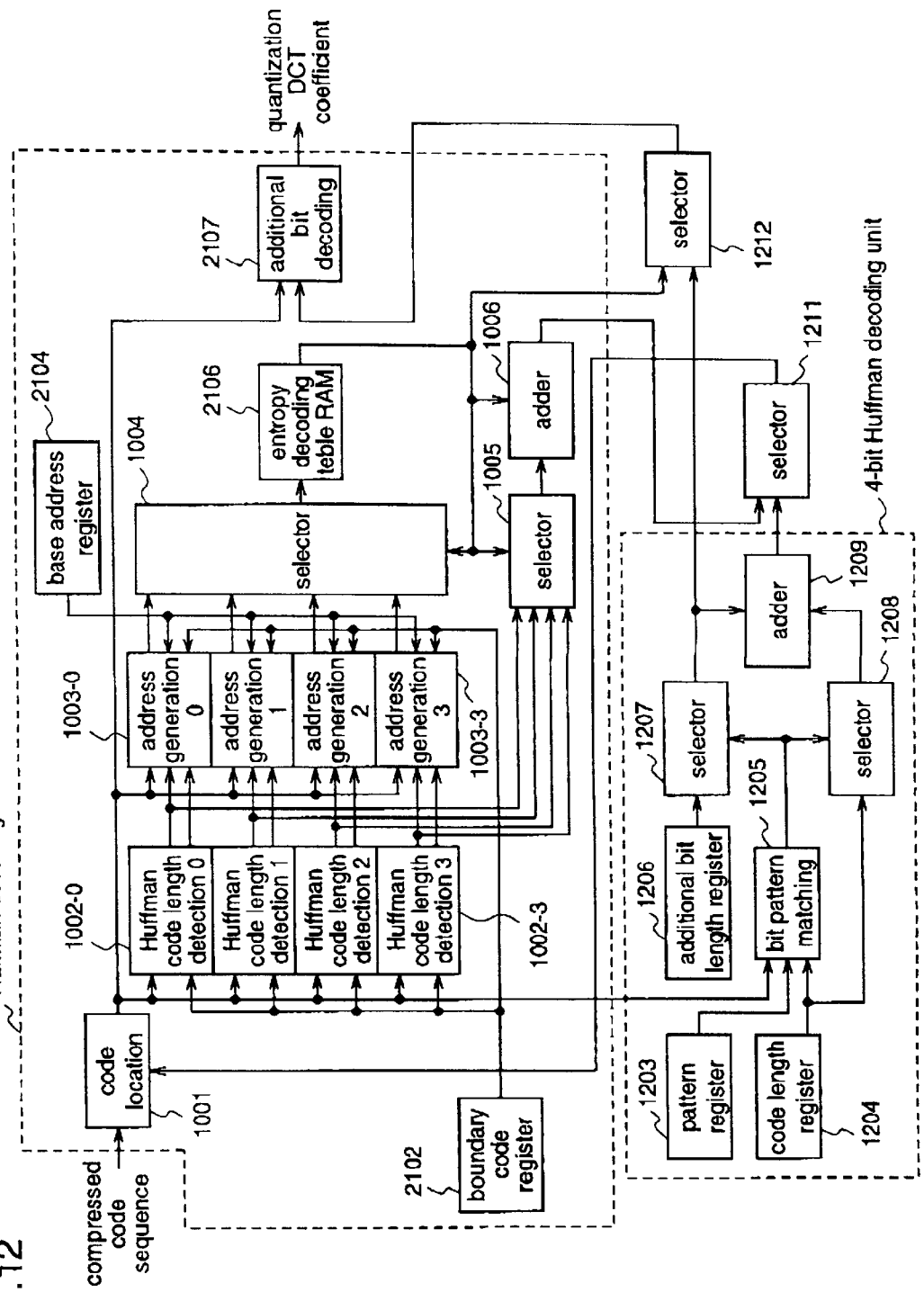
FIG. 12 is a block diagram illustrating a Huffman decoding unit according to a fourth embodiment of the present invention.
Figure 14:
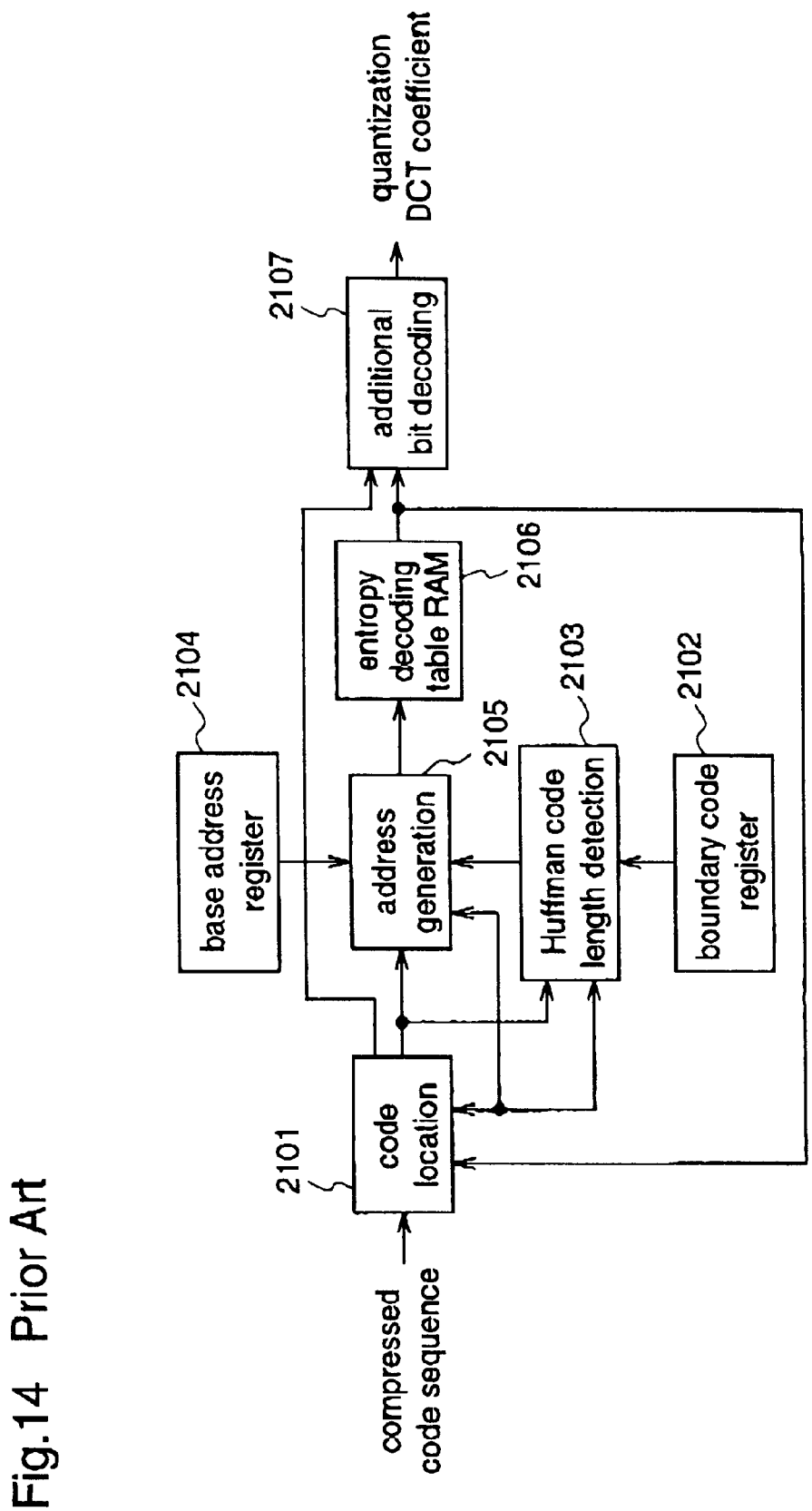
FIG. 14 is a block diagram illustrating a prior art Huffman decoding unit.
Figure 15:
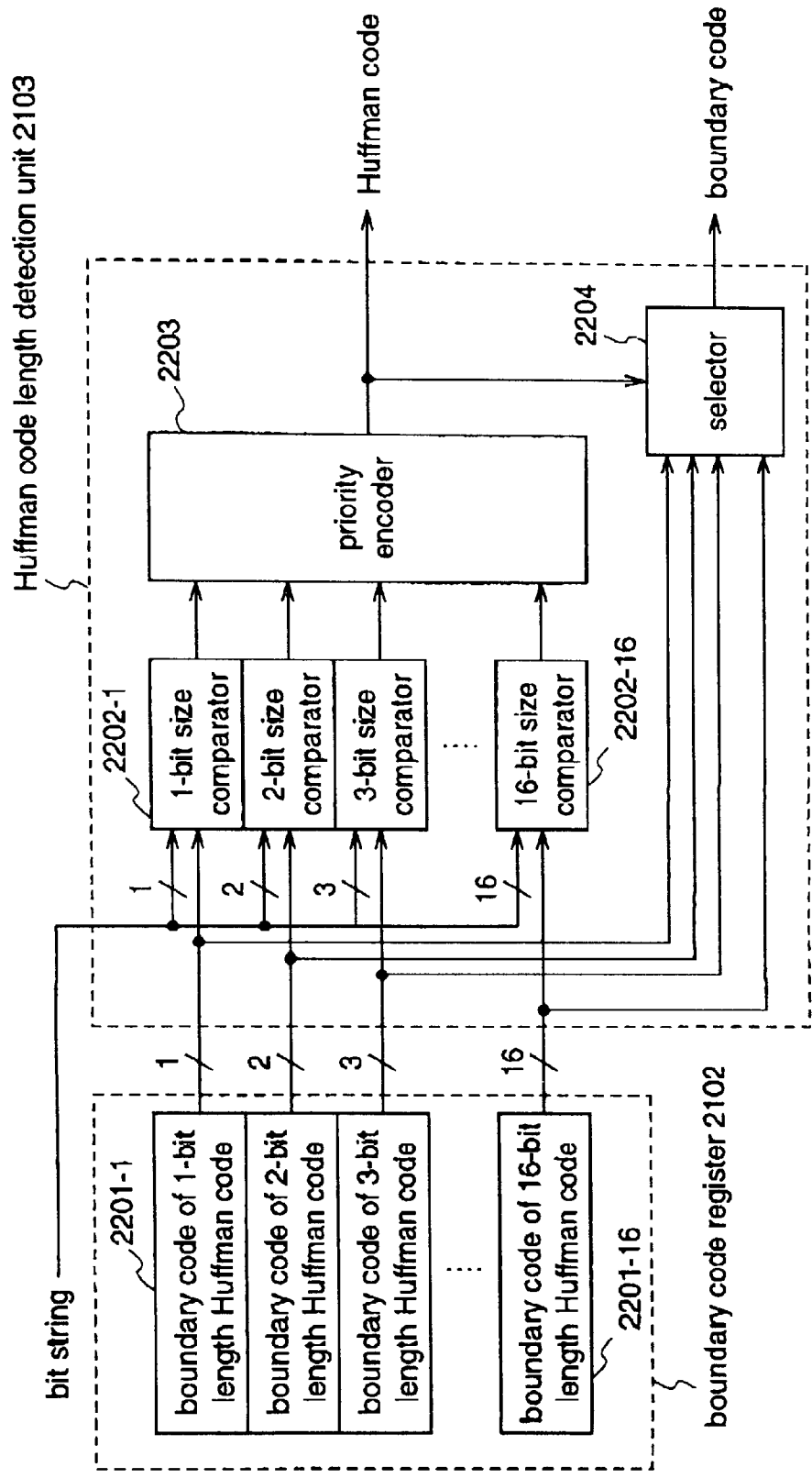
FIG. 15 is a block diagram illustrating a boundary code register and a Huffman code length detection unit of the prior art Huffman decoding unit.
Figure 16:
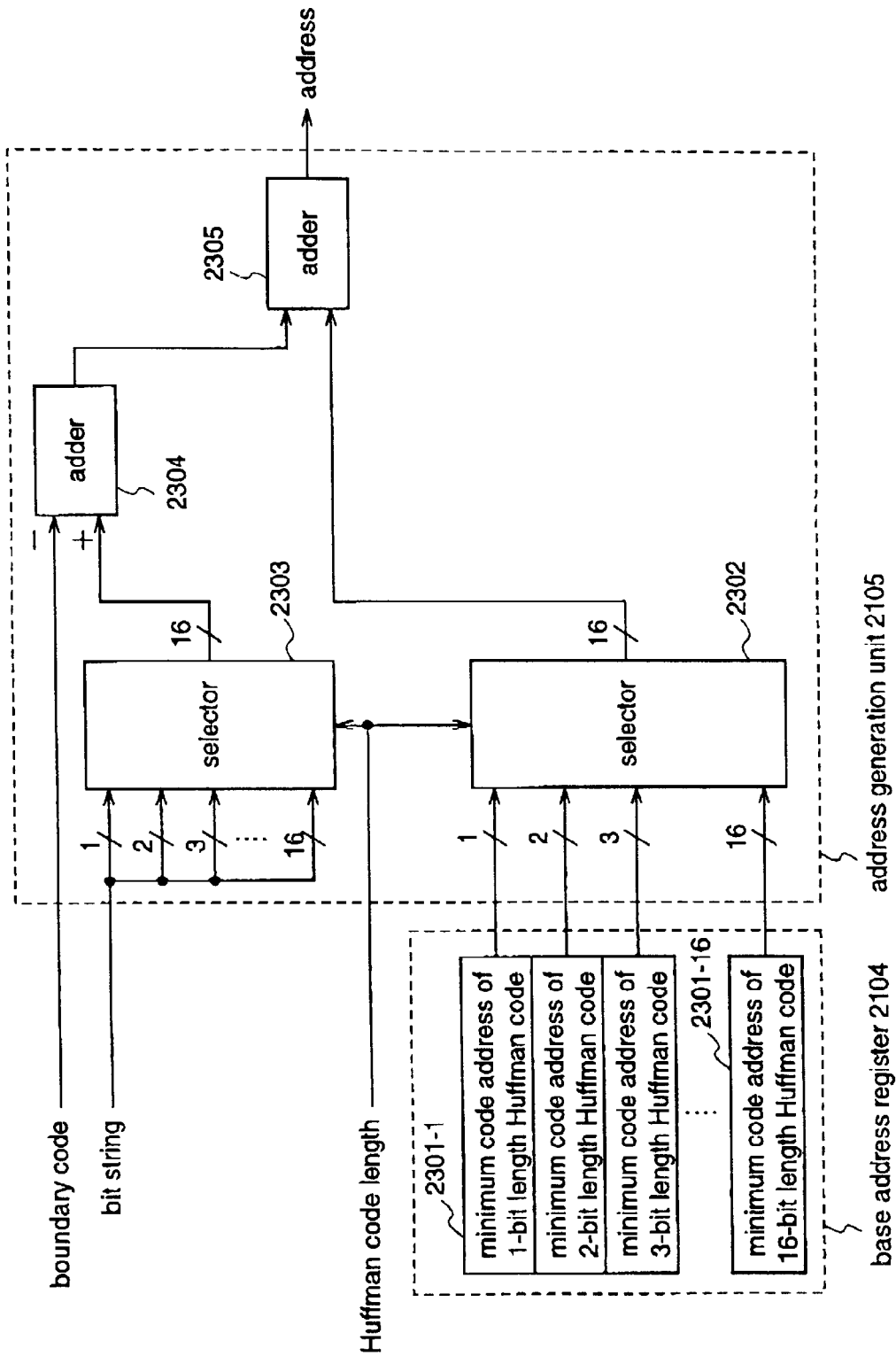
FIG. 16 is a block diagram illustrating a base address register and an address generation unit of the prior art Huffman decoding unit.
Figure 17:
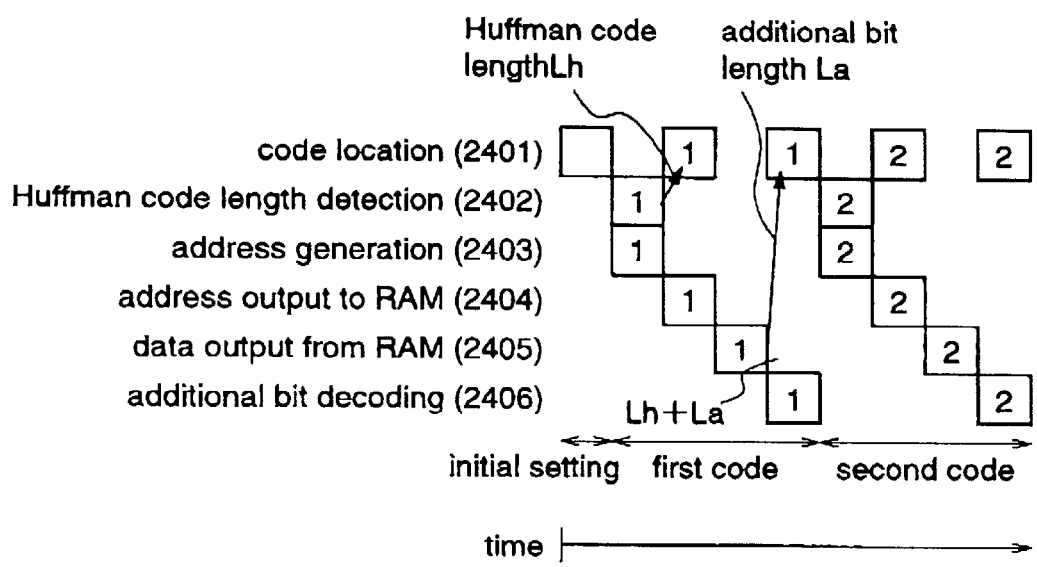
FIG. 17 is a diagram showing a timing chart of the prior art Huffman decoding unit.

FIG. 12 is a block diagram illustrating a Huffman decoding unit 206 according to the fourth embodiment. In FIG. 12, the same reference numerals as those in the prior art Huffman decoding unit or the Huffman decoding unit according to any of the first to third embodiments denote the same or corresponding elements.

The principle of the Huffman decoding unit according to the fourth embodiment is as follows: Since the processing time of the Huffman decoding unit of the third embodiment is slightly increased as compared to that in the first or second embodiment, an entropy decoding apparatus having a shorter processing time than that in the Huffman decoding unit of the third embodiment is added to compensate the increase in the processing time. Even when the added entropy decoding apparatus works only for a variable length code having a specific code length or shorter, this fourth embodiment can sufficiently obtain effects of the reduction in the processing time as a whole, because codes having shorter code lengths are allocated to more frequent events in the variables length coding.

Next, the respective elements in FIG. 12 are described in detail. As can be seen in FIG. 12, a 4-bit Huffman decoding unit 1210 is added to the Huffman decoding unit of the third embodiment. Hereinafter, the elements in FIG. 12 are described, while the same elements as those in the Huffman decoding unit of the third embodiment are not described here.

A code location unit 1201 extracts Lhmax bits from the next bit but "n" bits of the decoding start position, to output the same to a Huffman code length detection unit n (1002-n), as well as extracts a bit string of 4 bits as the maximum code length of pattern matching by a bit pattern matching unit 1205 from the decoding start position, to output the same to the bit pattern matching unit 1205. In addition, when the number of shift bits is obtained by a selector 1211, the code location unit 1201 performs the shift operation of the obtained number of shift bits, obtains the next data from the compressed code sequence as required, and locates the Huffman code or additional bit. To be more specific, the code location unit 1201 is different from that in the third embodiment in that the unit 1201 outputs a 4-bit string to the bit pattern matching unit 1205.

A pattern register 1203 is a register file for containing a bit pattern of a Huffman code which is entropy-decoded in one cycle by pattern matching, a code length register 1204 is a register file for containing a code length, and an additional bit length register 1206 is a register file for containing a bit length of an additional bit subsequent to the Huffman code.

The bit pattern matching unit 1205 compares as to whether the 4-bit bit string output by the code location unit 1201 matches the bit pattern stored in the pattern register 1203, in a range of effective code lengths stored in the code length register 1204, and when there is a matching row, outputs the row number thereof.

A selector 1207 selects an additional bit length corresponding to the row number which is output by the bit pattern matching unit 1205, from the additional bit length register 1206, to be output. A selector 1208 selects a Huffman code length corresponding to the row number which is output by the bit pattern matching unit 1205, from the code length register 1204, to be output.

An adder 1209 adds the Huffman code length Lh output by the selector 1208 and the additional bit length La output by the selector 1207, to be output.

A selector 1211 selects Lh+La when the bit length (Lh+La) is output from the adder 1209, and selects La'+Lh when the bit length (La'+Lh) is output from the adder 1006, and outputs the same as the number of shift bits. A selector 1212 selects La when the additional bit length La is output from the selector 1211, and selects La' when the additional bit length La' is output from the entropy decoding table RAM 2106, as the additional bit length, to be output.

FIG. 13 shows configurations of the pattern register 1203, the code length register 1204 and the additional bit length register 1206 in the 4-bit Huffman decoding unit 1210 of the fourth embodiment. In this fourth embodiment, all Huffman codes of 4 bits or shorter can be entropy-decoded by the 4-bit Huffman decoding unit 1210. Therefore, each of the register files has 16 rows. Usually, not all bit patterns are used in the case of Huffman code, and row numbers of unused patterns are shown by "-".

In this fourth embodiment, when a Huffman code having a code length of 4 bits or shorter is detected by the 4-bit Huffman decoding unit 1210, the entropy decoding is completed in one cycle by the 4-bit Huffman decoding unit 1210. When no Huffman code is detected by the 4-bit Huffman decoding unit 1210, it means that there is a Huffman code of 5 bits or longer. Therefore, the entropy decoding is carried out by the decoding unit 1202 which is the same as that shown in the third embodiment. In the entropy coding, codes having shorter code lengths are allocated to more frequent events, whereby most of the Huffman codes are decoded in one cycle by the 4-bit Huffman decoding unit 1210.

Accordingly, the processing speed is increased as a whole as compared to that in the third embodiment. In addition, since the Huffman codes which can be entropy-decoded in one cycle are limited to 4-bit length or shorter, the increase in the circuit scale due to the addition of the 4-bit Huffman decoding unit 1210 is small, resulting in only a small increase in the price of the digital still camera.

Particularly, in this fourth embodiment, the processes by the Huffman code length detection units 0 (1002-0)~3 (1002-3) and the address generation units 0 (1003-0)~3 (1003-3) cannot be carried out in one cycle. Therefore, the fourth embodiment has effects when carried out in two or more cycles.

In this fourth embodiment, the Huffman code which is entropy-decoded in one cycle is 4 bit length or shorter. However, it goes without saying that the Huffman codes can be of other bit lengths, such as 3 bits or shorter, and 5 bits or longer.

Further, in this fourth embodiment, the numbers Nh of the Huffman code length detection units 0 (1002-0)~3 (1002-3) and address generation units 0 (1003-0)~3 (1003-3) equal to the maximum code length of the Huffman code which can be entropy-decoded in one cycle by the 4-bit Huffman decoding unit 1210, but they can be different.

In addition, it is also possible to assume that the 4-bit Huffman decoding unit 1210 can entropy decode parts of Huffman codes of 4 bit length or shorter (for example, up to 8 which is half of the theoretically maximum number of patterns of the Huffman code which can be composed of bits up to 4, i.e.,, 16 patterns), and to entropy decode the Huffman codes which have 4-bit length but cannot be entropy-decoded by the 4-bit Huffman decoding unit 1210 by the Huffman decoding unit 1210 as shown in the third embodiment.

In this fourth embodiment, the 4-bit Huffman decoding unit 1210 comprises the already known common pattern matching means, while the decoding can be also carried out at high speed by a means other than the pattern matching means.

What is claimed is:

1. A decoder for decoding successive first and second variable length codes, with referring to a table which contains a relationship between variable length codes and decoded values comprising:

a code location unit for cutting out plural bit strings from plural different relative positions with respect to a reference position;

plural address candidate generation units each generating an address candidate to refer to the table for each of the plural cutout bit strings;

a table reference unit for referring to the table to get decoded values on the basis of the generated address candidates; and a control unit for operating the table reference unit for the first variable length code, while simultaneously operating the address candidate generation units for the second variable length code.

2. The decoder of claim 1 comprising:

a code length calculation unit for obtaining a code length of the input variable length code on the basis of a result of the table reference; and said table reference unit selecting a predetermined address from the plural table reference address candidates on the basis of the obtained code length.

3. The decoder of claim 1 wherein the number of the address candidate generation units is less than the number of possible kinds of variable length code, and the code location unit outputs a bit string to the address candidate generation units, respectively, with successively shifting the reference position.

4. The decoder of claim 1 wherein the variable length code is composed of an additional bit and a secondary variable length code which is obtained by coding at least a bit length of the additional bit, and the number of the address candidate generation units is equal to the number of possible kinds of bit length of the additional bit.

5. The decoder of claim 4 wherein the number of the address candidate generation units is less than the number of possible kinds of bit length of the additional bit, and the code location unit outputs a bit string to the address candidate generation units, respectively, with successively shifting the reference position.

6. The decoder of claim 1 comprising a decoding subunit for outputting at least a code length of a variable length code having a predetermined code length or shorter, for that variable length code.

7. A decoding method for decoding successive first and second variable length codes, with referring to a table which contains a relationship between variable length codes and decoded values comprising a step of:

simultaneously carrying out a process for referring to the table to get a decoded value for the first variable length code, and a process for generating plural table address candidates to refer to the table for the second variable length code, in parallel.

8. The decoding method of claim 7 comprising a step of:

selecting one address from the plural table address candidates on the basis of a code length of the first variable length code obtained from a result of the table reference for the first variable length code, to locate the second variable length code.

* * * * *